(12) United States Patent
Chiang

(10) Patent No.: US 12,672,549 B2
(45) Date of Patent: Jun. 30, 2026

(54) LIGHT SENSOR FOR PACKAGE INTRUSION DETECTION

(71) Applicant: Taiwan Semiconductor Manufacturing Company, Ltd., Hsinchu (TW)

(72) Inventor: Katherine H. Chiang, New Taipei City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 315 days.

(21) Appl. No.: 18/362,076

(22) Filed: Jul. 31, 2023

(65) Prior Publication Data
US 2025/0046735 A1 Feb. 6, 2025

(51) Int. Cl.
| | |
|---|---|
| *H10W 42/40* | (2026.01) |
| *H10D 84/80* | (2025.01) |
| *H10D 89/10* | (2025.01) |

(52) U.S. Cl.
CPC ........ *H10W 42/405* (2026.01); *H10D 84/811* (2025.01); *H10D 89/10* (2025.01)

(58) Field of Classification Search
CPC ...... H10D 84/40; H10D 84/60; H10D 84/811; H10D 84/813; H10D 89/10; H10W 42/405
See application file for complete search history.

(56) References Cited

U.S. PATENT DOCUMENTS

| | | | |
|---|---|---|---|
| 11,095,278 B2 | 8/2021 | Tanaka et al. | |
| 2004/0113161 A1* | 6/2004 | Suzuki | H10D 30/0314 |
| | | | 257/E21.414 |
| 2006/0163575 A1* | 7/2006 | Shih | H10F 39/8063 |
| | | | 257/E31.128 |
| 2008/0246064 A1 | 10/2008 | Kimura | |
| 2013/0075594 A1 | 3/2013 | Kozuma | |

(Continued)

FOREIGN PATENT DOCUMENTS

WO 2021095560 A1 5/2021

OTHER PUBLICATIONS

Yoo et al. "High Photosensitive Indium-Gallium-Zinc Oxide Thin-Film Phototransistor with a Selenium Capping Layer for Visible-Light Detection" ACS Appl. Mater. Interfaces 2020, 12, 10673-10680, published on Feb. 13, 2020.

(Continued)

*Primary Examiner* — Nelson Garces
(74) *Attorney, Agent, or Firm* — Eschweiler & Potashnik, LLC

(57) ABSTRACT
Some embodiments relate to an integrated device including a first thin film transistor (TFT) arranged over a substrate; a second TFT arranged over the substrate; a metal barrier layer arranged over the second TFT, where the metal barrier layer is configured to block incident radiation from reaching the second TFT; a Fresnel lens arranged over the first TFT, where the Fresnel lens is configured to focus incident radiation towards the first TFT; and where the first TFT and the second TFT are configured to be coupled to a differential amplifier, the differential amplifier being operable to detect the incident radiation by comparison of a first leakage current from the first TFT to a second leakage current from the second TFT.

20 Claims, 29 Drawing Sheets

200f

(56) References Cited

U.S. PATENT DOCUMENTS

2015/0287842 A1 * 10/2015 Kosten .................. H10F 77/488
136/244
2022/0360725 A1    11/2022 Kusuda
2023/0063673 A1 *   3/2023 Lu ....................... G08B 13/1895

OTHER PUBLICATIONS

Koklu et al. "Characterization of Standard CMOS Compatible Photodiodes and Pixels for Lab-on-Chip Devices" 2013 IEEE International Symposium on Circuits and Systems (ISCAS), published on Aug. 1, 2013.

Ruan et al. Abstract of "Photoresponsivity Enhancement and Extension of the Detection Spectrum for Amorphous Oxide Semiconductor Based Sensors" Advanced Electronic Materials (IF6.2), published on Feb. 1, 2019.

* cited by examiner

400a

400b

2400

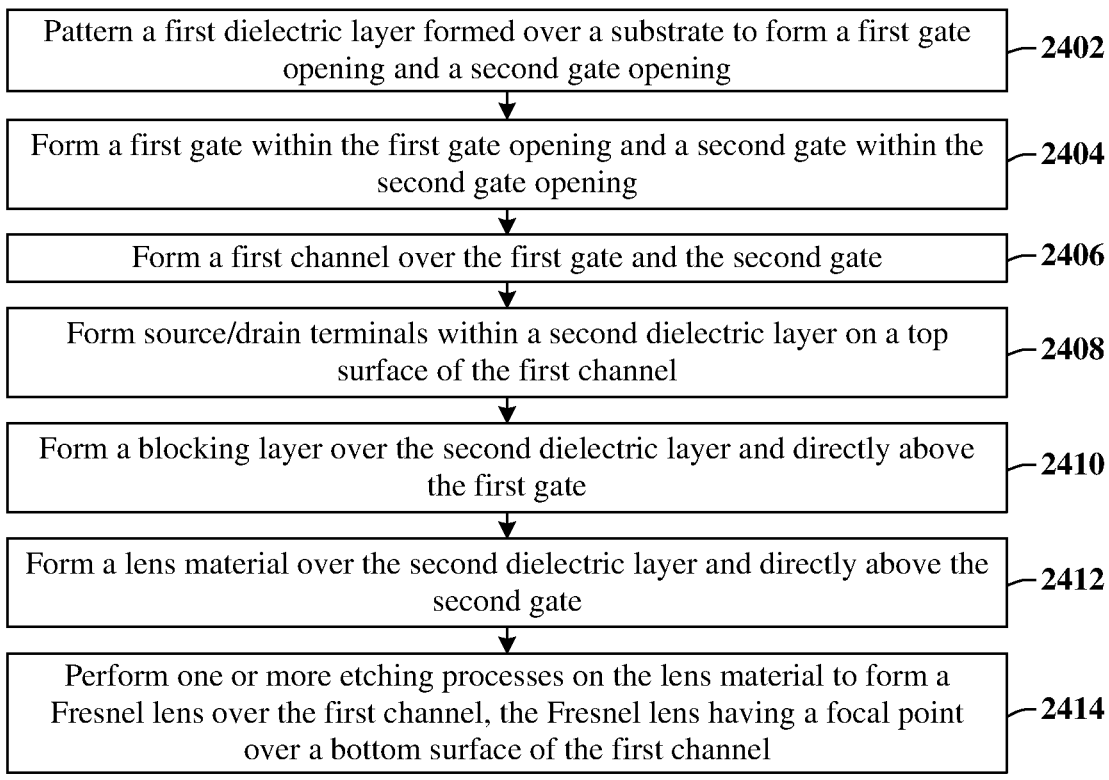

| Pattern a first dielectric layer formed over a substrate to form a first gate opening and a second gate opening | 2402 |
| Form a first gate within the first gate opening and a second gate within the second gate opening | 2404 |
| Form a first channel over the first gate and the second gate | 2406 |
| Form source/drain terminals within a second dielectric layer on a top surface of the first channel | 2408 |
| Form a blocking layer over the second dielectric layer and directly above the first gate | 2410 |
| Form a lens material over the second dielectric layer and directly above the second gate | 2412 |
| Perform one or more etching processes on the lens material to form a Fresnel lens over the first channel, the Fresnel lens having a focal point over a bottom surface of the first channel | 2414 |

Fig. 24

LIGHT SENSOR FOR PACKAGE INTRUSION DETECTION

BACKGROUND

Many modern day electronic devices are being more integrated into an internet of things (IoT). These devices may have access to a broader network. This access and the information available to the electronic devices makes them a target for intrusion attacks and reverse engineering. Intrusion detection is an important component of keeping devices secure. Intrusion detection is often performed utilizing light detection technology, such that a signal is detected when light shines on a detection circuit due to, for example, an outer cover being removed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 24 illustrates a methodology in flowchart format that illustrates some embodiments of a method of forming an intrusion detection circuit comprising a first TFT and a second TFT covered by a metal barrier layer.

DETAILED DESCRIPTION

Figure 1A:
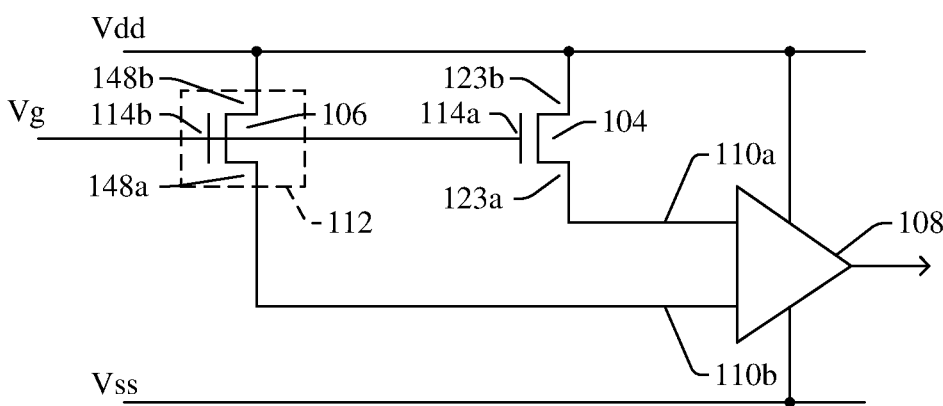
FIGS. 1A-1B illustrate circuit diagrams and cross-sectional views of some embodiments of an intrusion detection circuit comprising a first thin film transistor (TFT) and a second TFT covered by a metal barrier layer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern electronic devices increasingly have the ability to connect to wireless networks, forming an internet of things (IoT). Through the IoT, users are able to operate electronic devices without having to be physically near them, due to an exchange of data between the electronic devices. Wireless networks in public spaces are using base stations, repeaters, and other devices that are physically available near the spaces they are being used to better facilitate the growing demand by users. The physical presence of the electronic devices connected to the wireless network increases the risk of malicious entities accessing the physical components of the wireless network. Access to electronic devices connected to the network poses a security risk, as components of the electronic device may be damaged or subverted. Therefore, physical security in devices connected to the network is desirable.

Intrusion detection is an important component of security in electronic devices. If, for example, a malicious entity gains physical access to an electronic device, the first step in counteracting such an intrusion is knowing that the intrusion occurred. Some methods of intrusion detection include using a light sensing device, such as a photoresistor, photodiode, or the like. When a chassis of the electronic device is opened, light shines on the light sensing device, sending a signal (e.g., a current). In some devices, the signal from the light sensing device is compared to a similar light sensing device that does not detect the light (e.g., due to being covered by a barrier). In these devices, differences in the current between the two devices may exist prior to the intrusion. Further, in the event of an intrusion, the change in the current may be small compared to the normal variation between devices, such that detection of the intrusion may be difficult. Additionally, some light sensing devices have a higher leakage current than others, resulting in a greater amount of power consumed during operation. Light sensing devices are also often dependent on the temperature of the device. Changes in the temperature of the device may alter an output signal resulting from the same input, which may lead to inaccuracies in the readings. An intrusion detection circuit that is low power, with a high change in current due to light detection, and a low difference in current without light detection is desirable.

Various embodiments of the present disclosure relate to an intrusion detection circuit comprising a first thin film transistor (TFT) and a second TFT respectively configured to operate as a light sensing device and a covered non-light sensing device. A Fresnel lens is formed above the first TFT, increasing a concentration of light striking a channel of the first TFT. A differential amplifier is coupled to the first TFT and the second TFT. The first TFT and the second TFT are configured to detect differences in the leakage current between the first TFT and the second TFT. The increased concentration of light striking the channel of the first TFT increases a leakage current of the first TFT (e.g., by over three orders of magnitude), so that the difference between the leakage current of the first TFT and the leakage current of the second TFT is increased. Because TFTs have a low leakage current, the power consumption of the intrusion detection circuit is relatively low. Furthermore, despite the low power consumption the increased difference between the leakage current caused by the Fresnel lens allows for the disclosed intrusion detection circuit to accurately detect unwanted intrusions on an electronic device.

Figure 1B:
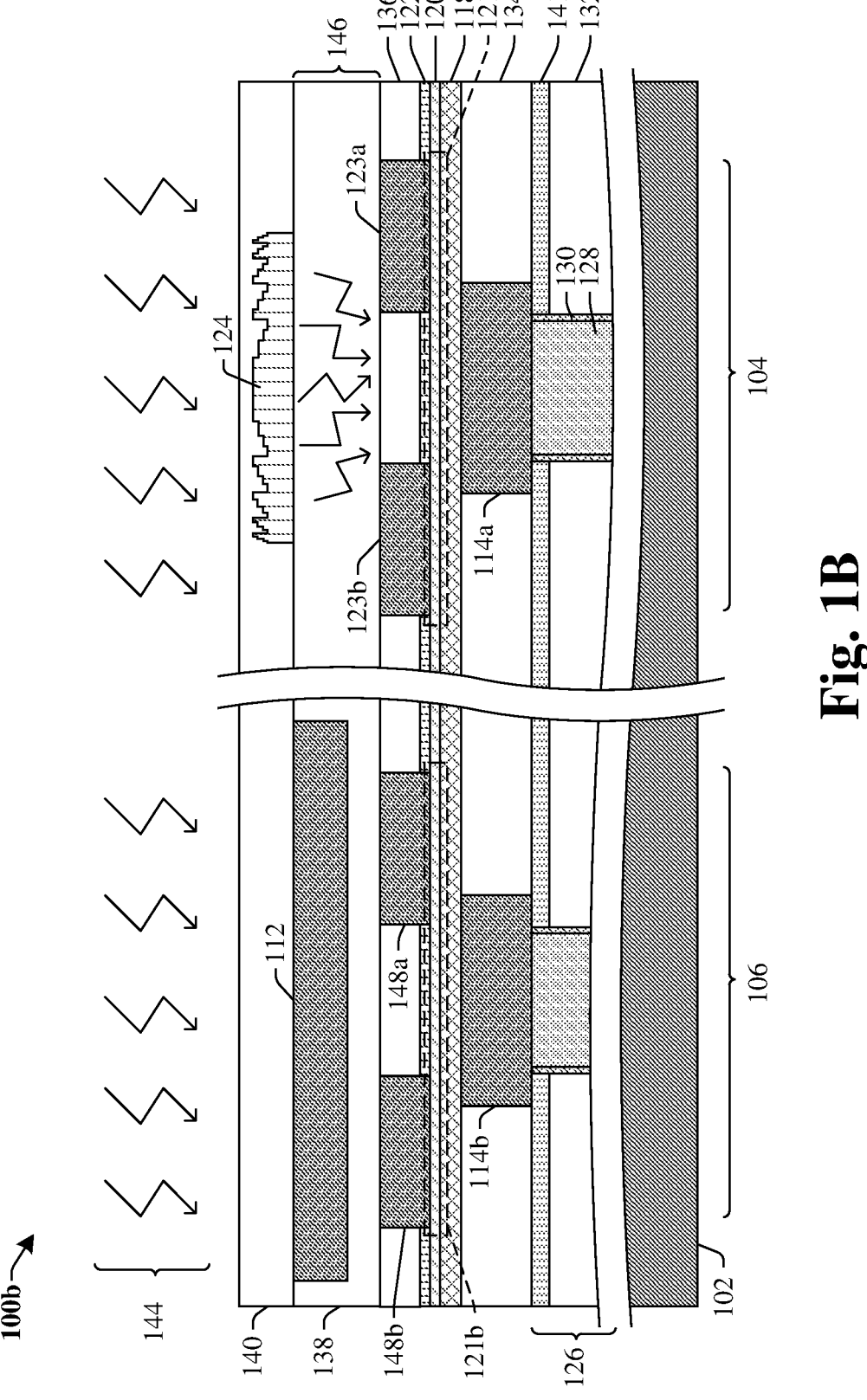

FIGS. 1A-1B illustrate a circuit diagram 100a and a cross-sectional view 100b of some embodiments of an intrusion detection circuit comprising a first thin film transistor (TFT) and a second TFT covered by a metal barrier layer.

As shown in the circuit diagram 100a of FIG. 1A, a first TFT 104 and a second TFT 106 are coupled to a differential amplifier 108. A first source/drain terminal 123a of the first TFT 104 is coupled to a first input 110a of the differential amplifier 108. A first source/drain terminal 148a of the second TFT 106 is coupled to the second input 110b of the differential amplifier 108. A first gate electrode 114a of the first TFT 104 and a second gate electrode 114b of the second TFT 106 are coupled to a gate line. The gate line biases the gates of the first TFT 104 and the second TFT 106 at a gate voltage Vg. In some embodiments, Vg is between −30 and −1 volts, between −3 and −0.5 volts, between −10 and −2 volts, or another similar range. In some embodiments, a second source/drain terminal 123b of the first TFT 104 and a second source/drain terminal 148b of the second TFT 106 are coupled to a positive rail biased at Vdd. In some embodiments, Vdd is between 8 and 12 volts, between 5 and 15 volts, between 10 and 20 volts, or another similar range. A metal barrier layer 112 extends over the second TFT 106, blocking incident light from reaching the second TFT 106.

FIG. 1B shows some embodiments of a cross-sectional view 100b corresponding to FIG. 1A. As shown in cross-sectional view 100b, the first TFT 104 and the second TFT 106 are arranged over a substrate 102. An interconnect structure 126 comprising a first wire level 128 extends beneath the first TFT 104. In some embodiments, a wire barrier layer 130 surrounds outer sidewalls of the first wire level 128. A first dielectric 132 surrounds the first wire level 128 beneath the first gate electrode 114a and the second gate electrode 114b. In some embodiments, an etch stop layer 141 extends between the first gate electrode 114a and the first dielectric 132. A second dielectric 134 surrounds the first gate electrode 114a and the second gate electrode 114b. A gate dielectric 118 overlies the first gate electrode 114a and the second gate electrode 114b. A channel layer 120 overlies the gate dielectric 118. The channel layer 120 comprises a first channel 121a extending between the first source/drain terminal 123a and the second source/drain terminal 123b of the first TFT 104. The channel layer 120 further comprises a second channel 121b extending between the first source/drain terminal 148a and the second source/drain terminal 148b of the second TFT 106.

In some embodiments, a capping layer 122 extends over the first channel 121a and the second channel 121b. The capping layer 122 is configured to improve the electrical properties of the first TFT 104 and the second TFT 106. For example, in some embodiments the capping layer 122 may comprise a material having a work function that is smaller than that of the channel layer 120, so as to inject electrons into the channel layer 120 and thus improve electrical characteristics.

The first source/drain terminals 123a, 148a and the second source/drain terminals 123b, 148b overlie the channel layer 120 and are surrounded by a third dielectric 136. A fourth dielectric 138 separates the first and second source/ drain terminals 123a, 123b, 148a, 148b from a Fresnel lens 124 and surrounds the metal barrier layer 112. The metal barrier layer 112 overlies the second TFT 106 and has an outer sidewall facing the first TFT 104. That is, the metal barrier layer 112 does not extend directly over the first TFT 104. The Fresnel lens 124 is directly over the first TFT 104.

During operation, in the event of an intrusion, incident light 144 may shine on the intrusion detection circuit. The incident light 144 is blocked from reaching the second TFT by the metal barrier layer 112, and is focused towards the first channel 121a of the first TFT 104 by the Fresnel lens 124. The focused light 146 then enters the first channel 121a and energizes electrons into the conduction band, increasing the leakage current of the first TFT 104. The increased leakage current raises a voltage detected by the differential amplifier 108 (see FIG. 1A) in the first input 110a, resulting in a signal being output from the differential amplifier 108, successfully detecting the intrusion. The similarity of the first TFT 104 and the second TFT 106 results in the leakage currents of the first TFT 104 and the second TFT 106 being different by less than one order of magnitude until an intrusion occurs.

The addition of a Fresnel lens further increases the amount of light gathered at the channel layer 120, thereby increasing the number of electrons entering the conduction band and the leakage of the first TFT 104 due to the incident light. The increase in incident light results in a device that is more sensitive to changing light levels and therefore better at detecting intrusions. Further, the change in the leakage current caused by changing light levels lasts longer than the light levels detected. That is, an intrusion may be detected after the incident light stops shining on the first TFT. This results in the intrusion detection circuit detecting intrusions after returning from an "off" state or a temporary outage. Utilizing TFTs (e.g., the first TFT 104 and the second TFT 106) as light sensing devices has the advantage of reducing the effect of temperature changes compared to other light sensing technologies. For example, the change in leakage current of the first TFT 104 in the event of an intrusion is greater than three orders of magnitude between 30 degrees Celsius and 120 degrees Celsius in some configurations.

FIGS. 2A-2F illustrates cross-sectional views of some embodiments of a TFT with a Fresnel lens. It will be appreciated that the Fresnel lenses shown in the following figures are not to scale. That is, the Fresnel lens may be large and thicker than the underlying TFT, and may be directly above multiple TFTs.

Figure 2A:
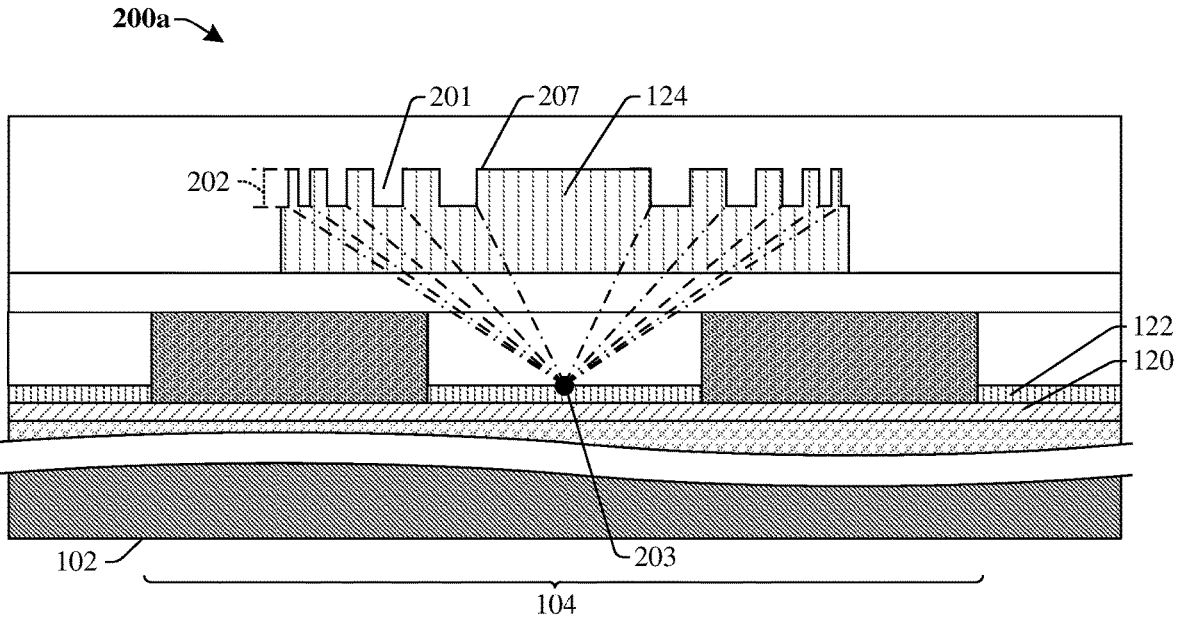
FIGS. 2A-2F illustrates cross-sectional views of some embodiments of a TFT with a Fresnel lens.

As shown in the cross-sectional view 200a of FIG. 2A, in some embodiments, the Fresnel lens 124 is a binary Fresnel lens (e.g., a Fresnel lens having upper surfaces at two different heights over a bottom of the Fresnel lens). A binary Fresnel lens can be formed by performing one etch to form grooves 201 of a first depth 202 below the top surface 207 of a lens material. The grooves 201 of a Fresnel lens 124 are designed to concentrate light in a chosen spectrum at a focal point 203. For example, the grooves 201 of a Fresnel lens may be designed to concentrate light with a 470 nanometer wavelength, a 530 nanometer wavelength, or another, similar wavelength. In some embodiments, the focal point 203 of the Fresnel lens 124 is between a top surface of the capping layer 122 and a bottom surface of the channel layer 120. The width of the grooves decreases across a radius of the Fresnel lens 124, increasing the angle at which the light is refracted. That is, the further incident light is from the center of the Fresnel lens, the more the incident light is refracted. The grooves 201 are concentric rings surrounding a center of the Fresnel lens 124. In some embodiments, other amounts of grooves 201 may be formed in the Fresnel lens 124. For example, two, five, ten, or twenty grooves 201 may be formed in the Fresnel lens 124.

Figure 2B:
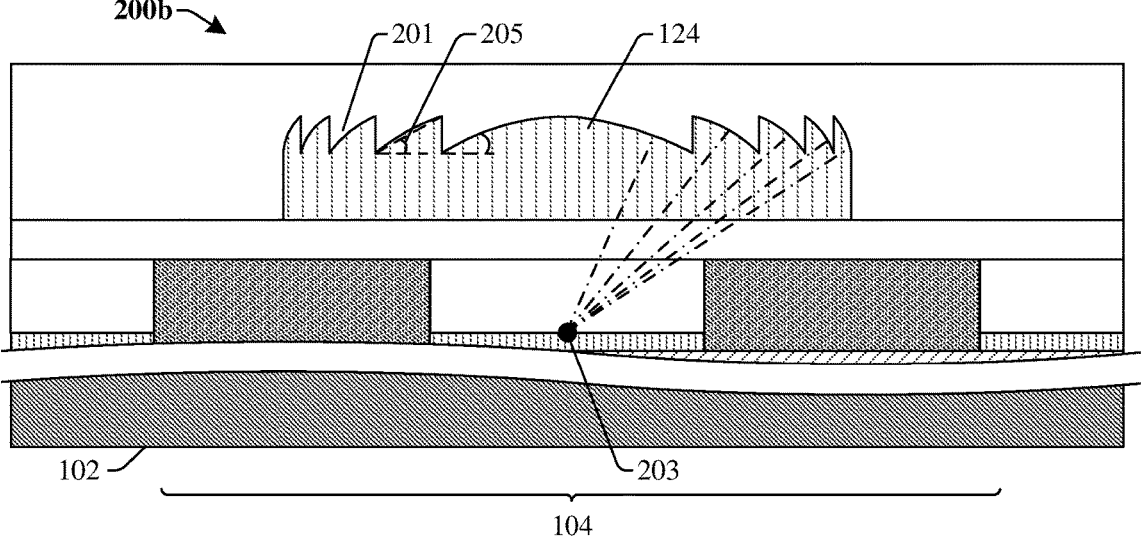

As shown in the cross-sectional view 200b of FIG. 2B, in some embodiments, the Fresnel lens 124 is a continuous Fresnel lens. A continuous Fresnel lens can be formed by performing a plurality of etches on a continuous lens to form multiple concentric grooves 201 in the upper surface of the lens. The grooves 201 result in the Fresnel lens 124 having slope facets at varying slope angles 205. The slope angles 205 are greater for slope facets near the outer edge of the Fresnel lens 124 and smaller near the center of the Fresnel lens 124. This change in the slope angle 205 of the slope facets results in incident light striking the slope facets near the outer edge of the Fresnel lens to be refracted at a greater angle, directing the incident light towards the focal point 203 of the Fresnel lens 124.

Figure 2C:
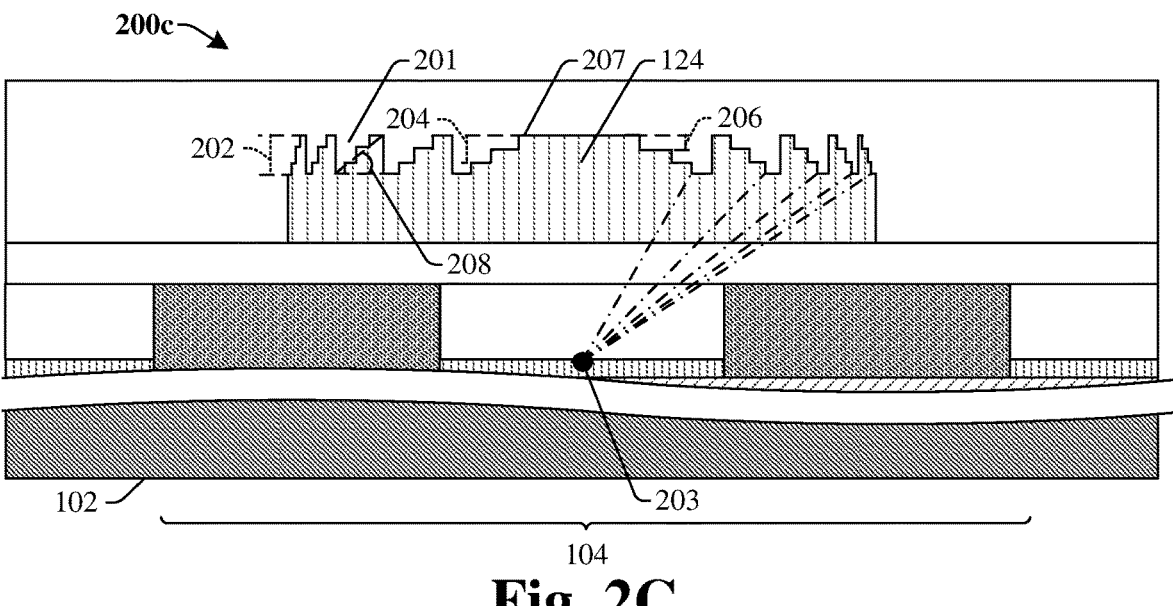

As shown in the cross-sectional view 200c of FIG. 2C, in some embodiments, the Fresnel lens 124 is a multi-level Fresnel lens. A multi-level Fresnel lens can be formed by performing a plurality of etches to form grooves 201 of a first depth 202, a second depth 204, and a third depth 206 below the top surface 207 of the lens material. The second depth 204 is less than the first depth 202, and the third depth 206 is less than the second depth 204. The multi-level Fresnel lens has approximated slope angles 208 measured between a horizontal line level with the first depth 202 and a line between outermost points of the grooves 201 at the first depth 202 and innermost points of the grooves at the top surface of the Fresnel lens 124. The widths of the grooves 201 decrease at greater distances from the center of the Fresnel lens 124, and the approximated slope angles 208 increase at greater distances from the center of the Fresnel lens 124. The changes in the widths of the grooves and the approximated slope angles 208 result in incident light striking the Fresnel lens near the outer edge to be refracted at a greater angle, directing the incident light towards the focal point 203 of the Fresnel lens 124.

Figure 2D:
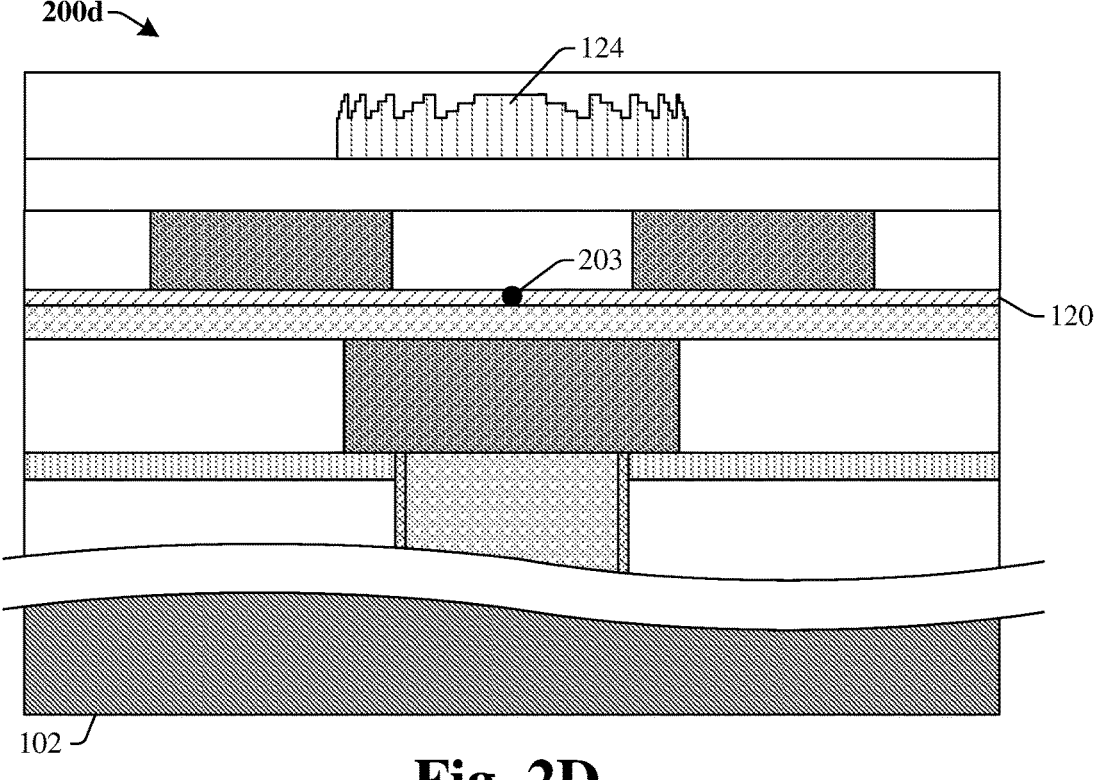

As shown in the cross-sectional view 200d of FIG. 2D, in some embodiments, a capping layer (See FIG. 1B) is not arranged over the channel layer 120. In some embodiments, the material of the channel layer 120 may detect incident light in the visible spectrum without the inclusion of the capping layer 122. The focal point 203 of the Fresnel lens 124 is between a top surface of the channel layer 120 and the bottom surface of the channel layer 120.

Figure 2E:
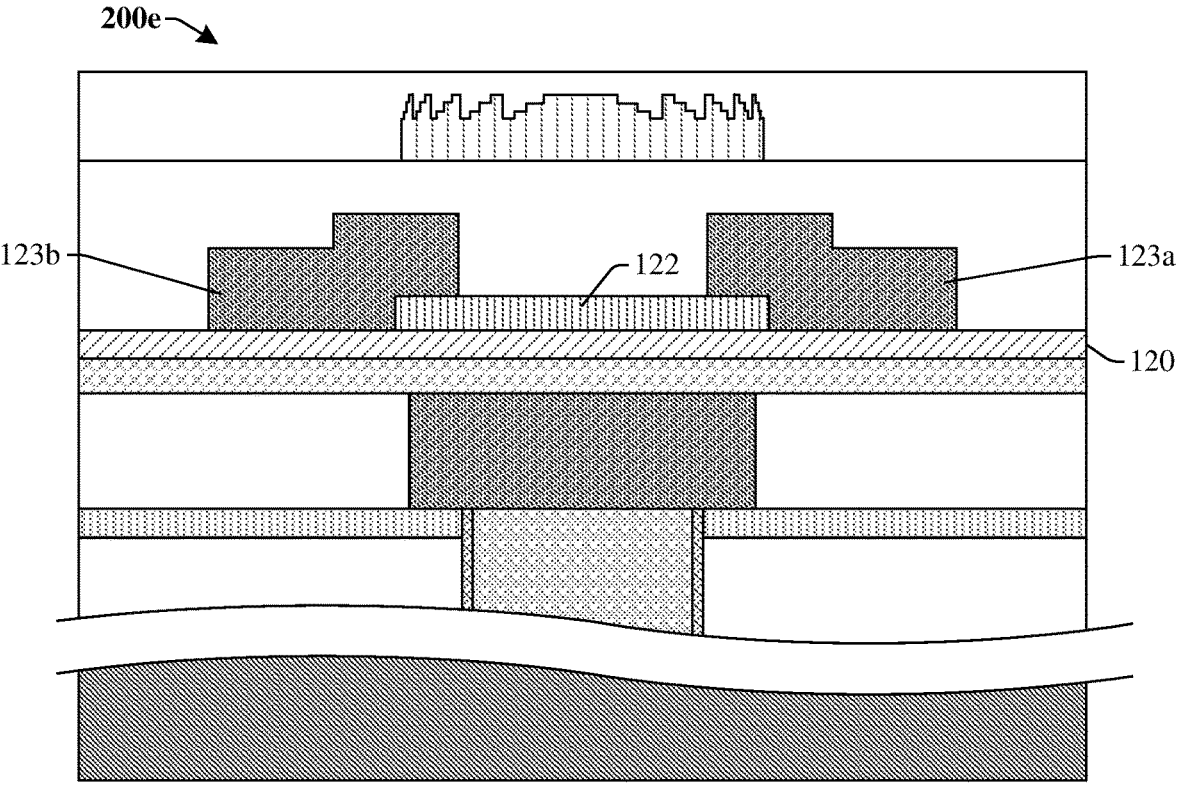

As shown in the cross-sectional view 200e of FIG. 2E, in some embodiments, the first source/drain terminal 123a and the second source/drain terminal 123b extend directly over the capping layer 122. The capping layer contacts outer sidewalls and lower surfaces of the first source/drain terminal 123a and the second source/drain terminal 123b.

Figure 2F:
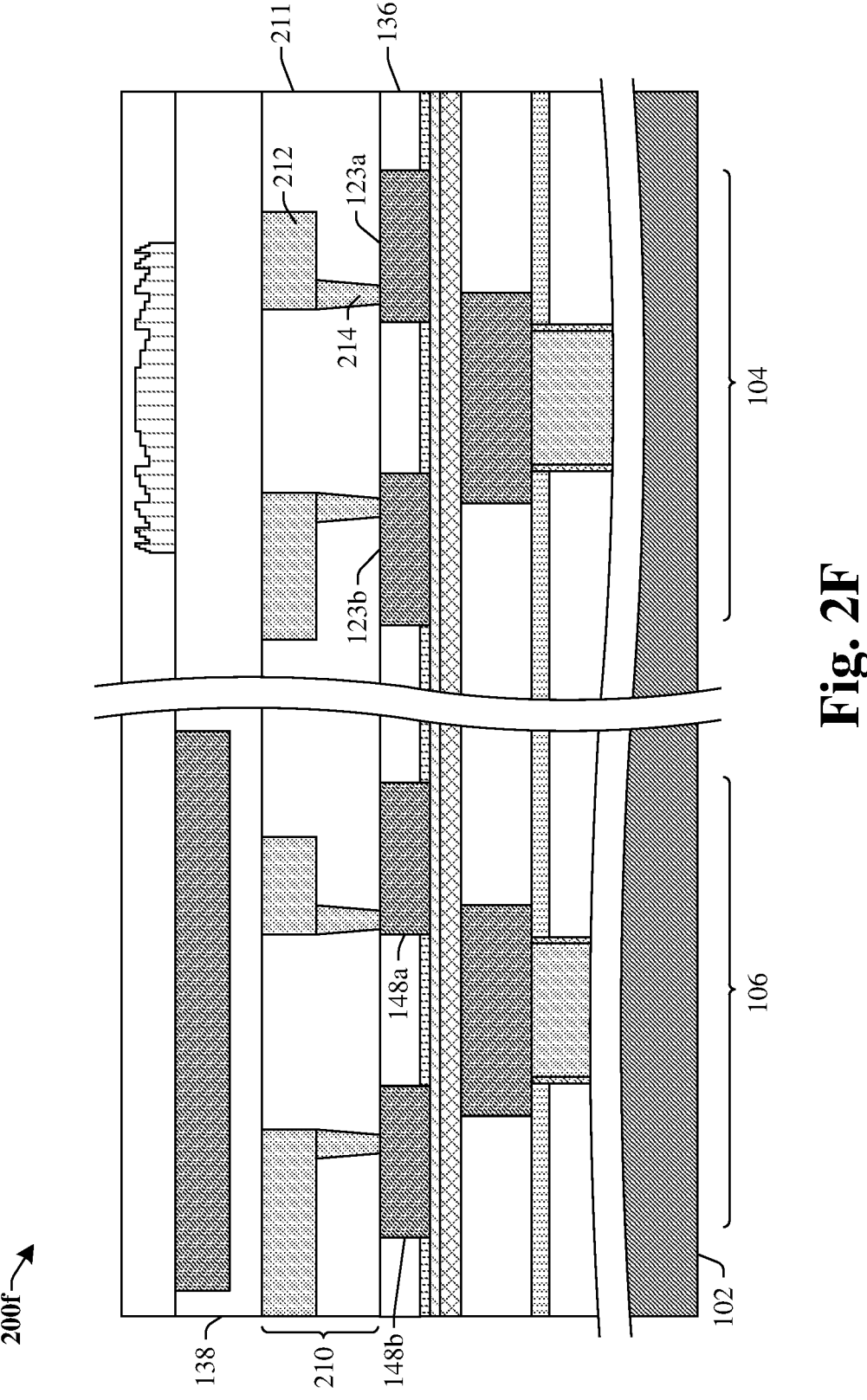

As shown in the cross-sectional view 200f of FIG. 2F, in some embodiments, a second interconnect structure 210 extends between the third dielectric 136 and the fourth dielectric 138. The second interconnect structure 210 comprises one or more wire levels 212 and one or more via levels 214 within an interconnect dielectric 211. The first source/drain terminals 123a, 148a and the second source/drain terminals 123b, 148b are coupled to the one or more wire levels 212 by the one or more via levels 214. The one or more wire levels 212 electrically couple the first and second source/drain terminals 123a, 123b, 148a, 148b to other components of the intrusion detection circuit such as the positive rail biased at Vdd (see FIG. 1A) and the first and second inputs (see 110a and 110b of FIG. 1A).

Figure 3A:
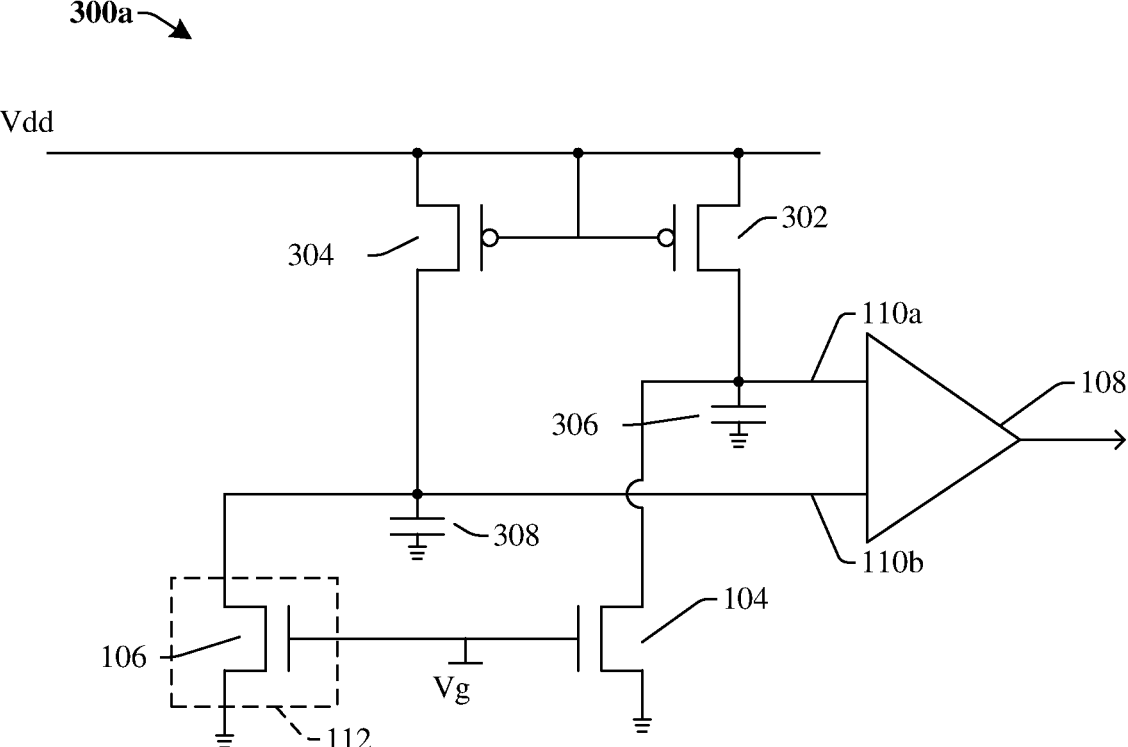
FIGS. 3A-3B illustrate a circuit diagram and a cross-sectional view of some embodiments of an intrusion detection circuit comprising TFTs and complementary metal-oxide-semiconductor (CMOS) transistors.
Figure 3B:
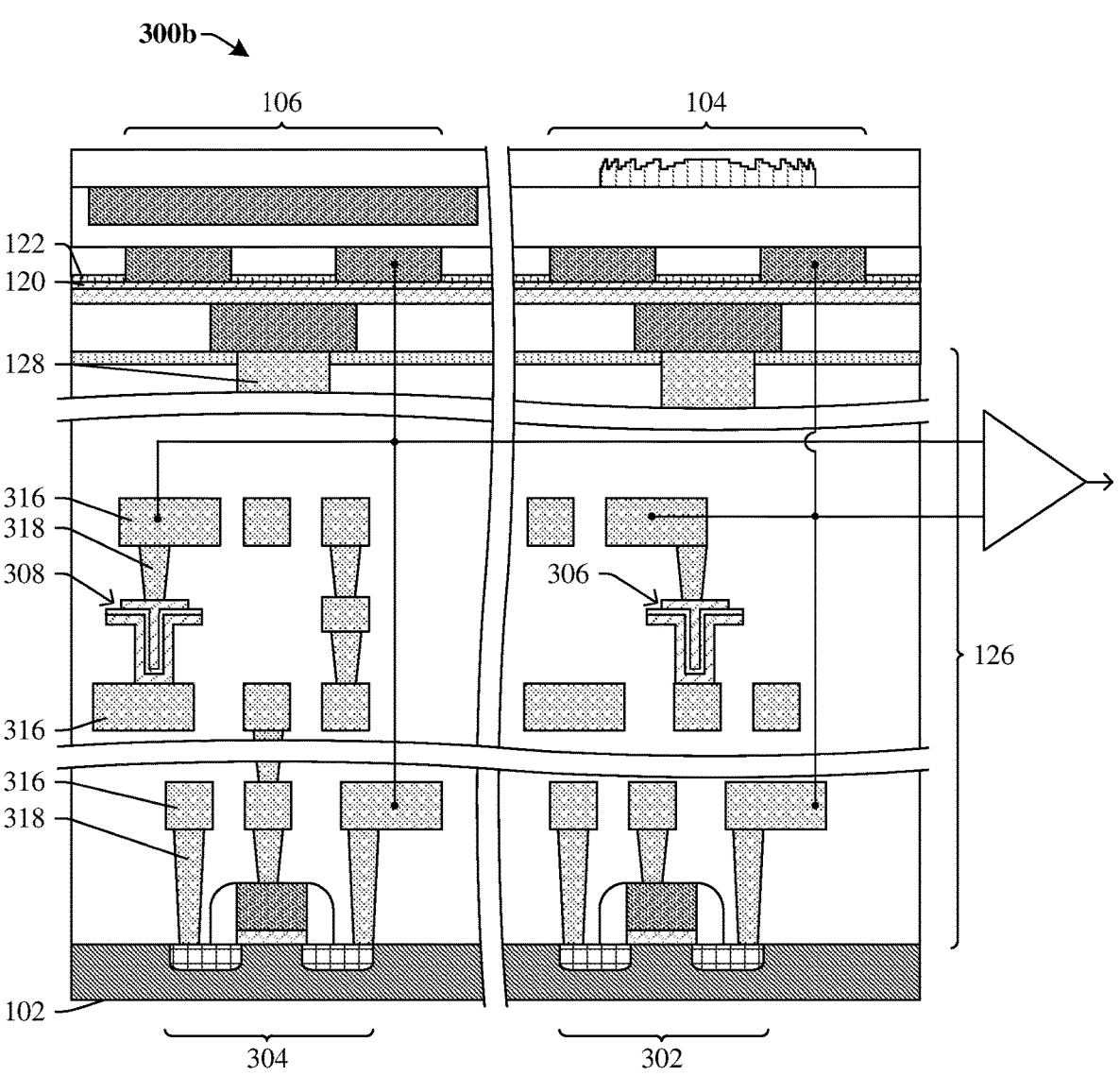

FIGS. 3A-3B illustrate a circuit diagram and a cross-sectional view of some embodiments of an intrusion detection circuit comprising TFTs and complementary metal-oxide-semiconductor (CMOS) transistors.

As shown in the circuit diagram 300a of FIG. 3A, a first CMOS transistor 302 is coupled to the first input 110a of the differential amplifier 108 and a second CMOS transistor 304 is coupled to the second input 110b of the differential amplifier 108. Further, a first capacitor 306 is coupled to the first input 110a and a second capacitor is coupled to the second input 110b. Gates of the first CMOS transistor 302 and the second CMOS transistor 304 have a negative bias, resulting in the first CMOS transistor 302 and the second CMOS transistor 304 passing leakage currents to the first and second inputs 110a. 110b. During operation, the first CMOS transistor 302 and the second CMOS transistor 304 have substantially equal leakage currents that are greater than the leakage currents of the first TFT 104 and the second TFT 106. The mismatch in leakage currents causes charge to build up at the first capacitor 306 and the second capacitor 308. The charge of the first capacitor 306 and the second capacitor 308 results in a voltage being read at the differential amplifier. As the charges on the first capacitor 306 and the second capacitor 308 are substantially equal, with voltage read by the differential amplifier at the first input 110a and the second input 110b is also substantially equal.

In the event of an intrusion, incident light shines on the first TFT 104 and the metal barrier layer 112. The incident light raises the leakage current of the first TFT 104 by 3 or more orders of magnitude. This leakage current reduces the charge at the first capacitor 306, lowering the voltage read by the differential amplifier at the first input 110a. The metal barrier layer 112 prevents the second TFT 106 from being affected by the incident light, maintaining the leakage current of the second TFT 106 before the intrusion. The charge at the second capacitor 308 is maintained, and the voltage read at the second input 110b is maintained. The difference in the voltage read at the first input 110a and the voltage read at the second input 110b results in a signal being output from the differential amplifier 108.

As shown in the cross-sectional view 300b of FIG. 3B, the first CMOS transistor 302 and the second CMOS transistor 304 are on the substrate 102. In other embodiments, the first CMOS transistor 302 and the second CMOS transistor 304 are over the substrate within the interconnect structure 126. In some embodiments, the first CMOS transistor 302 and the second CMOS transistor 304 are or comprise one of a planar FET, a FinFET, and a gate-all-around (GAA) device. The first CMOS transistor 302 and the second CMOS transistor 304 are coupled to the interconnect structure 126. In some embodiments, the interconnect structure 126 comprises one or more additional wire levels 316 and one or more via levels 318. The additional wire levels 316 provide lateral connections to components in the interconnect structure 126 and the via levels 318 provide vertical connections between components in the interconnect structure 126. In some embodiments, the first capacitor 306 and the second capacitor 308 are within the interconnect structure 126. It will be appreciated that the first capacitor 306 and the second capacitor 308 are not limited to a three-dimensional MIM capacitor. In some embodiments, the first capacitor 306 and the second capacitor 308 individually may be or comprise a metal oxide semiconductor capacitor (MOSCAP), a two dimensional metal-insulator-metal (MIM) capacitor, or another type of capacitor. In further embodiments, the first capacitor 306 and the second capacitor 308 are between the first CMOS transistor 302 and the first TFT 104. In some embodiments, the first CMOS transistor 302 and the second CMOS transistor 304 are formed simultaneously to reduce the difference in leakage current due to small variations in the process used.

In some embodiments, the capping layer 122 extends over the channel layer 120. The capping layer 122 is or comprises a material with a smaller bandgap over a range of wavelengths than the material of the channel layer 120. The smaller bandgap of the capping layer 122 may extend the spectrum of light detected by the first TFT 104. In other embodiments, the material of the channel layer 120 may detect incident light in the desired spectrum without the inclusion of a capping layer 122. In some embodiments, the desired spectrum is within the visible range. In some embodiments, the channel layer 120 is or comprises indium gallium zinc oxide (IGZO), indium tungsten zinc oxide (IWZO), the like, or a combination of the forgoing. In some embodiments, the capping layer 122 is or comprises selenium (Se), tin oxide (SnO), the like, or a combination of the foregoing. The material of the capping layer 122 also informs the leakage current of the first and second TFTs 104, 106, as the capping layer 122 extends directly between the source/drain terminals and across the channel layer 120. The material of the capping layer 122 is chosen to preserve the temperature stability of the leakage current of the first and second TFTs. In other embodiments, the channel layer 120 is doped with a material with a smaller bandgap than the material of the channel layer 120 instead of forming the capping layer 122.

Figure 4A:
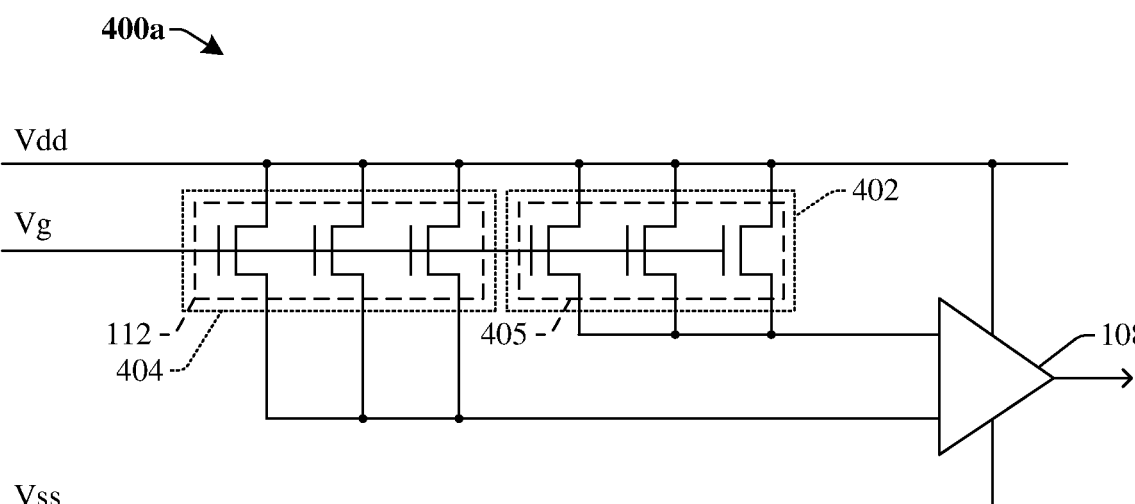
FIG. 4A-4B illustrate circuit diagrams of some embodiments of an intrusion detection circuit comprising arrays of TFTs.
Figure 4B:
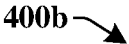
Figure 4B:
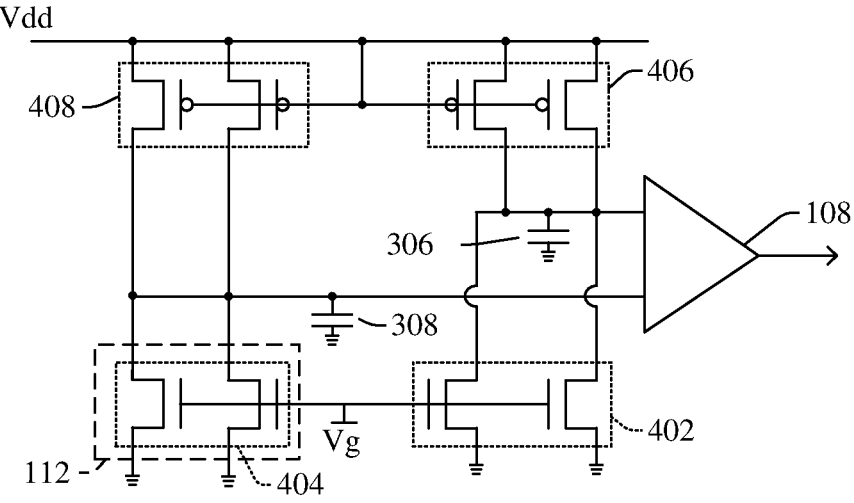

FIG. 4A-4B illustrate circuit diagrams of some embodiments of an intrusion detection circuit comprising arrays of TFTs.

As shown in the circuit diagram 400a of FIG. 4A, in some embodiments, a first array of TFTs 402 and a second array of TFTs 404 are coupled to the differential amplifier 108. The first array of TFTs 402 has a first combined leakage current and the second array of TFTs 404 has a second combined leakage current. The first array of TFTs 402 and the second array of TFTs 404 have an equal number of TFTs to reduce the difference between the first combined leakage current and the second combined leakage current. The metal barrier layer 112 is directly over the TFTs in the second array of TFTs 404. During operation, if one TFT of first array of TFTs or the second array of TFTs 404 fails or is inoperable, the other TFTs in the arrays will maintain operation of the intrusion detection circuit. In some embodiments, an array of Fresnel lenses 405 is arranged over the first array of TFTs 402. In some embodiments, the number of Fresnel lenses in the array of Fresnel lenses 405 is less than the number of TFTs in the first array of TFTs 402. In other embodiments, a single Fresnel lens (see 124 if FIG. 1B) is formed over the first array of TFTs 402.

As shown in the circuit diagram 400b of FIG. 4B, in some embodiments, a first array of CMOS transistors 406 and a second array of CMOS transistors 408 are coupled to the differential amplifier 108. The first array of CMOS transistors 406 has a third combined leakage current and the second array of CMOS transistors 408 has a fourth combined leakage current. The first array of CMOS transistors 406 and the second array of CMOS transistors 408 have an equal number of CMOS transistors to reduce the difference between the third combined leakage current and the fourth combined leakage current. During operation, if one CMOS transistor of first array of CMOS transistors 406 or the second array of CMOS transistors 408 fails or is inoperable, the other CMOS transistors in the arrays will maintain operation of the intrusion detection circuit.

With reference to FIGS. 5 through 23, cross-sectional views of some embodiments of a method of forming an intrusion detection circuit comprising a first thin film transistor (TFT) and a second TFT covered by a metal barrier layer are provided. Although FIGS. 5 through 23 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 5:
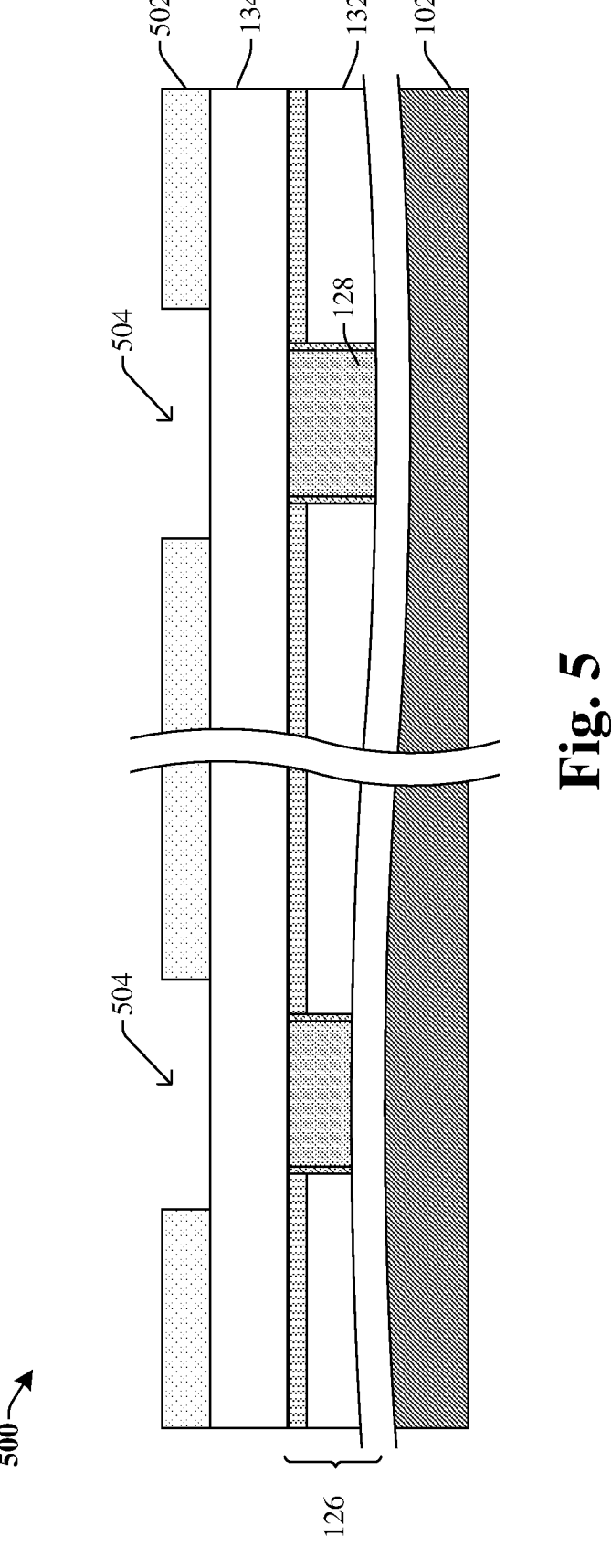
FIGS. 5 through 23 illustrate a series of cross-sectional views of a method of forming an intrusion detection circuit comprising a first thin film transistor (TFT) and a second TFT covered by a metal barrier layer.

As shown in the cross-sectional view 500 of FIG. 5, the interconnect structure 126 within the first dielectric 132 over the substrate 102 is provided, formed, or otherwise acquired. A first masking layer 502 is then formed over the second dielectric 134. In some embodiments, the first masking layer 502 may be, for example, a photoresist. In some embodiments, the first masking layer 502 may be formed using one of a deposition process or a spin-on process. The first masking layer 502 is then patterned to form first openings 504 in the first masking layer 502. In some embodiments, the first masking layer 502 is patterned using photolithography or the like. The first openings 504 overlie first wire level 128 of the interconnect structure 126. In some embodiments, the first dielectric 132 and the second dielectric 134 is or comprises silicon oxide ($SiO_2$), silicon nitride ($Si_3N_4$), a low-K dielectric material, or an extreme low-K dielectric material. In some embodiments, the interconnect structure 126 is or comprises a metal, such as aluminum, copper, or combinations thereof.

Figure 6:
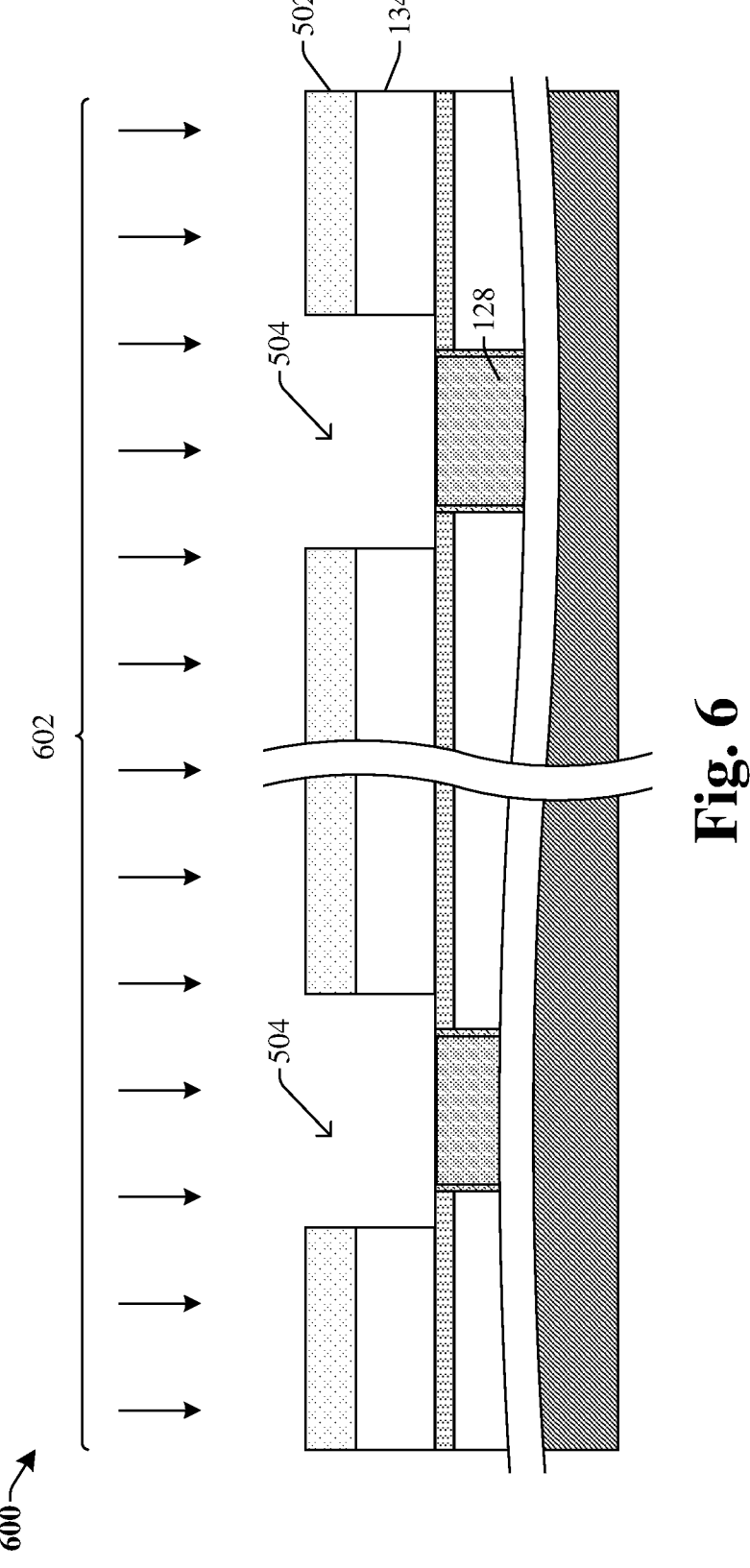

As shown in the cross-sectional view 600 of FIG. 6, a first etching process 602 is performed, removing portions of the second dielectric 134 exposed by the first openings 504, extending the first openings 504 into the second dielectric 134. In some embodiments, the first etching process 602 is a dry etch (e.g., a plasma dry etch). The first etching process 602 exposes upper surfaces of the first wire level 128 of the interconnect structure 126. The first masking layer 502 is subsequently removed using, for example, a stripping process or an ashing process.

Figure 7:
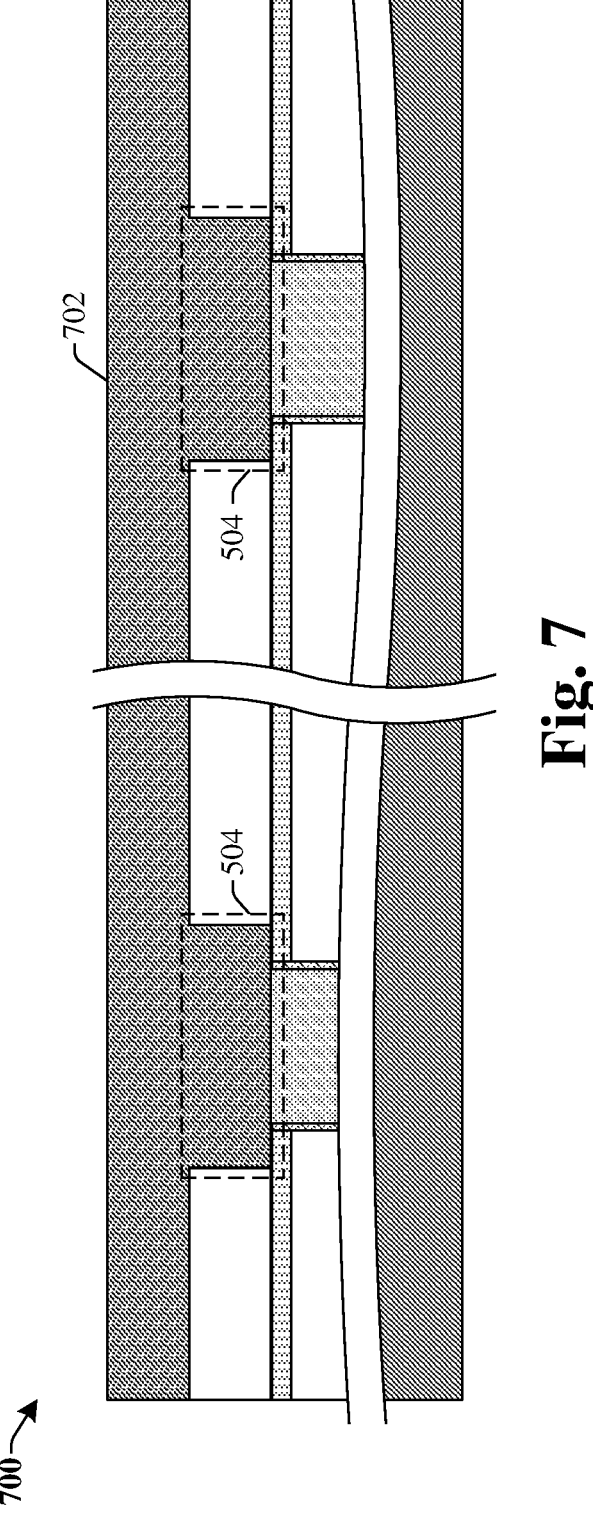

As shown in the cross-sectional view 700 of FIG. 7, a gate material 702 is formed in the first openings 504 (shown in phantom). In some embodiments, the gate material 702 is or comprises a conductive material such as, for example, titanium nitride (TiN), tantalum nitride (TaN), titanium (Ti), tantalum (Ta), the like, or a combination of the foregoing. The gate material 702 may be formed using one or more of atomic layer deposition (ALD), chemical vapor deposition (CVD), physical vapor deposition (PVD), or the like.

Figure 8:
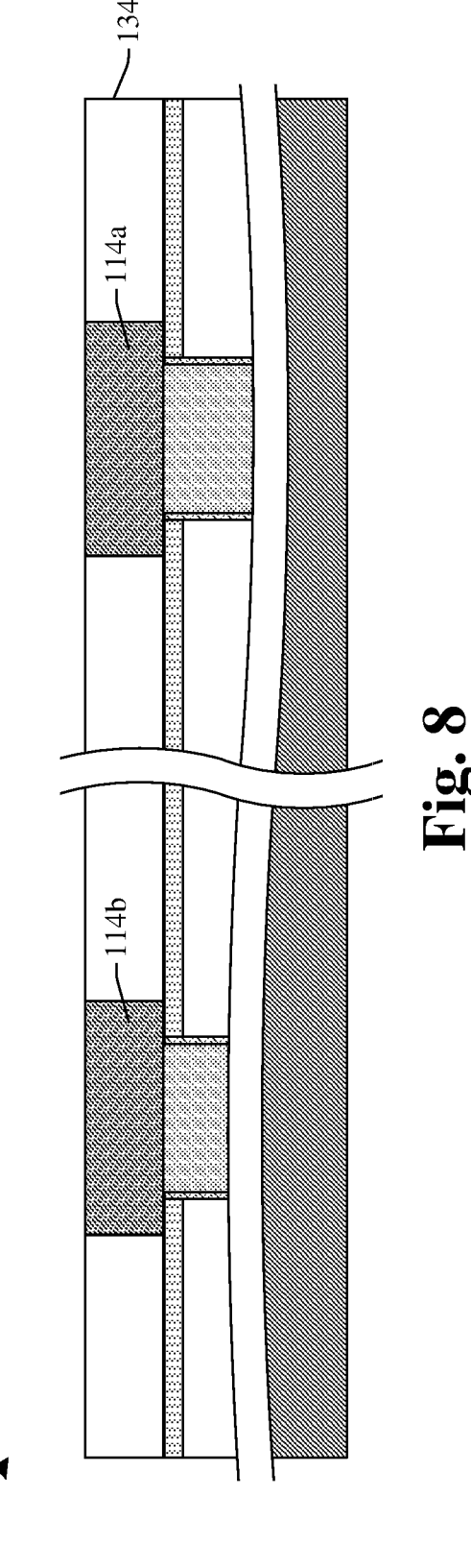

As shown in the cross-sectional view 800 of FIG. 8, portions of the gate material (e.g., 702 of FIG. 7) above an upper surface of the second dielectric 134 are removed, forming the first and second gate electrodes 114a. 114b. In some embodiments, the portions of the gate material are removed using a planarization process (e.g., a chemical mechanical planarization (CMP) process).

Figure 9:
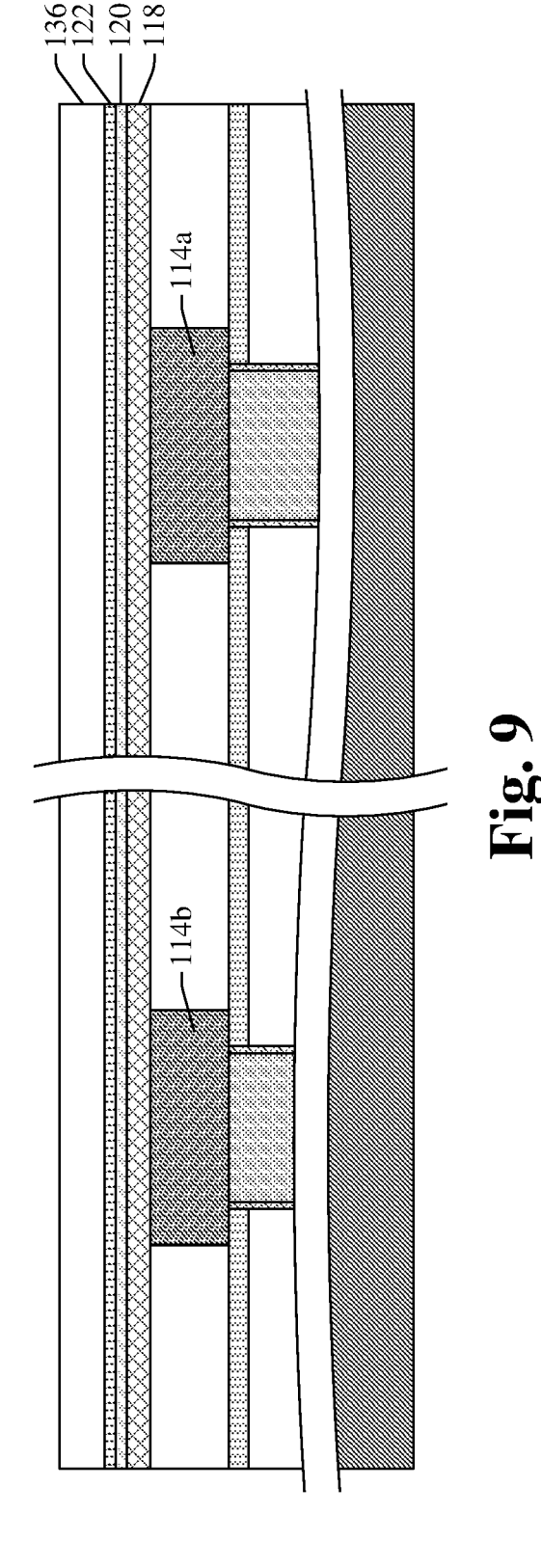

As shown in the cross-sectional view 900 of FIG. 9, the gate dielectric 118, the channel layer 120, the capping layer 122, and the third dielectric 136 are deposited in succession over the first gate electrode 114a and the second gate electrode 114b. In some embodiments, the gate dielectric 118, the channel layer 120, the capping layer 122, and the third dielectric 136 are respectively deposited using one or more of ALD, CVD, PVD, or the like.

Figure 10:
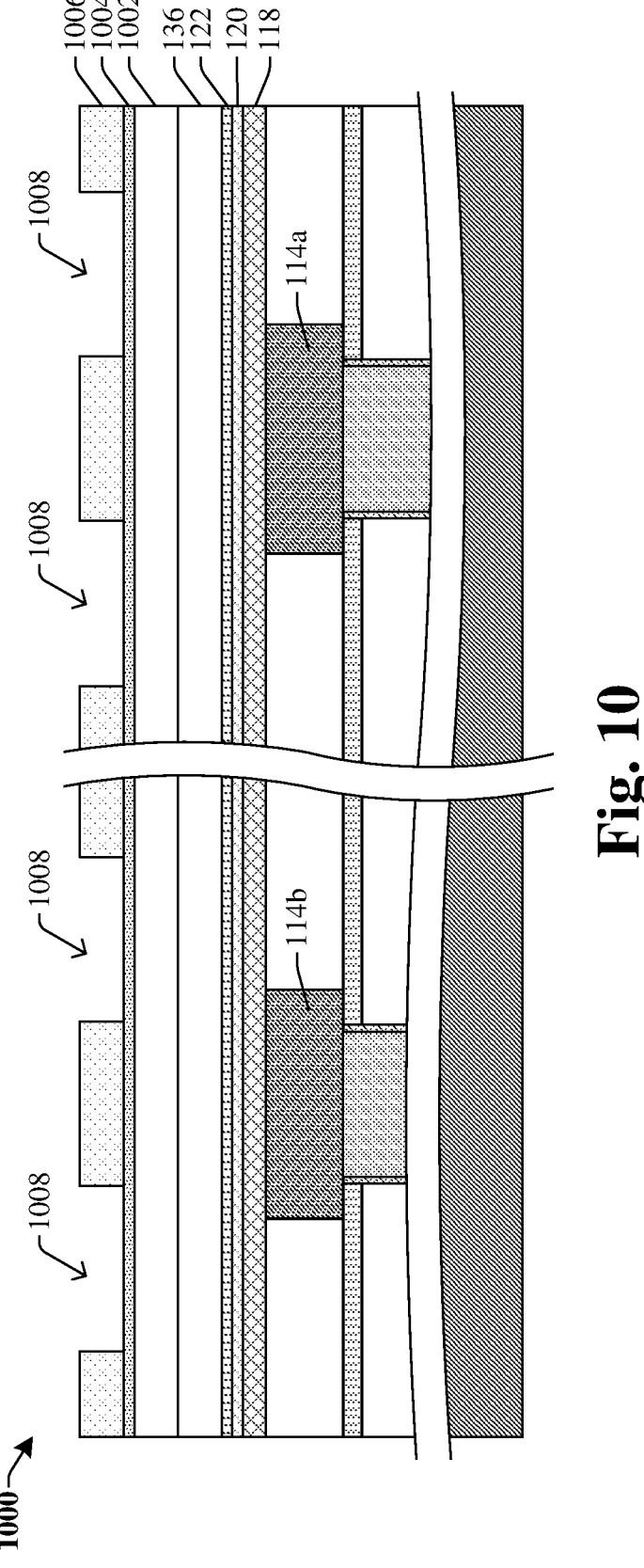

As shown in the cross-sectional view 1000 of FIG. 10, a second masking layer is formed over third dielectric 136. In some embodiments, the second masking layer may comprise a tri-layer mask comprising a bottom layer 1002, a middle layer 1004, and a top layer 1006 formed in succession over the third dielectric 136. In some embodiments, the bottom layer 1002, the middle layer 1004, and the top layer 1006 are formed using one or more deposition or spin-on processes. In some embodiments, the bottom layer 1002 and the middle layer 1004 may comprise a dielectric (e.g., spin on carbon, an antireflective coating, etc.), and the top layer 1006 is or comprises a photoresist. The top layer 1006 may be patterned to form second openings 1008 in the top layer 1006. In some embodiments, the top layer 1006 is patterned using photolithography or the like. The second openings 1008 overlie outer sidewalls of the first and second gate electrodes 114a, 114b.

Figure 11:
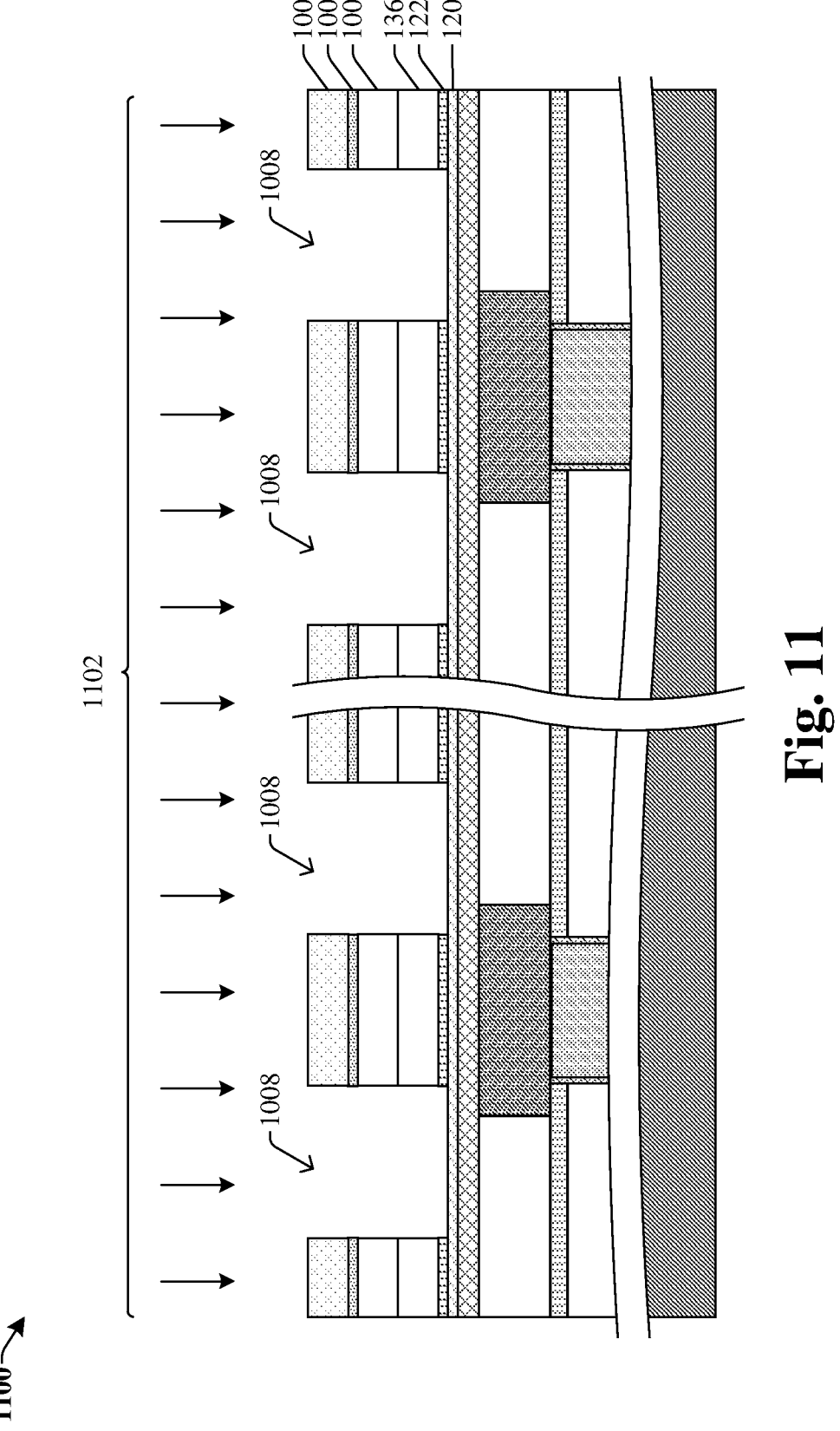

As shown in the cross-sectional view 1100 of FIG. 11, a second etching process 1102 is performed, removing portions of the middle layer 1004, the bottom layer 1002, the third dielectric 136, and the capping layer 122 directly beneath the second openings 1008, extending the second openings 1008 into the capping layer 122. In some embodiments, the second etching process 1102 is a dry etch (e.g., a plasma dry etch). The second etching process 1102 exposes an upper surface of the channel layer 120. The top layer 1006, the middle layer 1004, and the bottom layer 1002 are subsequently removed using, for example, one or more of a stripping process, an ashing process, or a planarization process.

Figure 12:
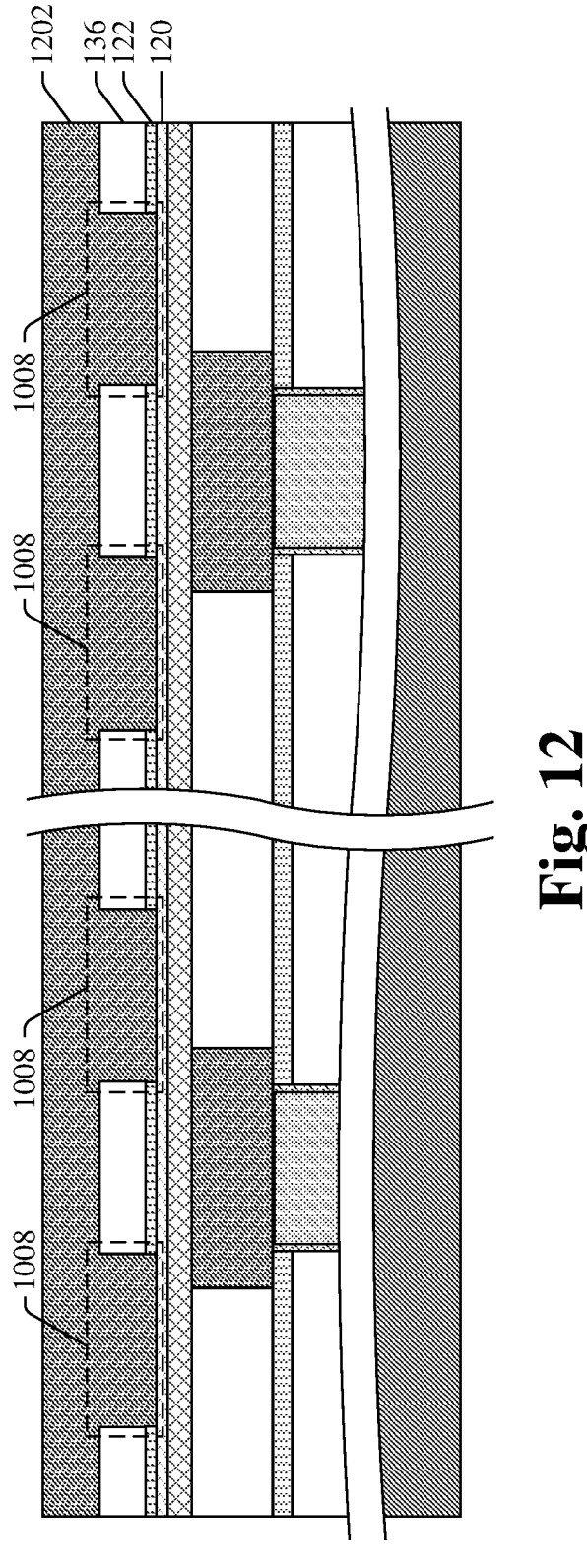

As shown in the cross-sectional view 1200 of FIG. 12, a source/drain material 1202 is deposited in the second openings 1008 and over the third dielectric 136. In some embodiments, the source/drain material 1202 contacts an upper surface of the channel layer 120 and outer sidewalls of the capping layer 122. The source/drain material 1202 may be formed using one or more of ALD, CVD, PVD, or the like.

Figure 13:
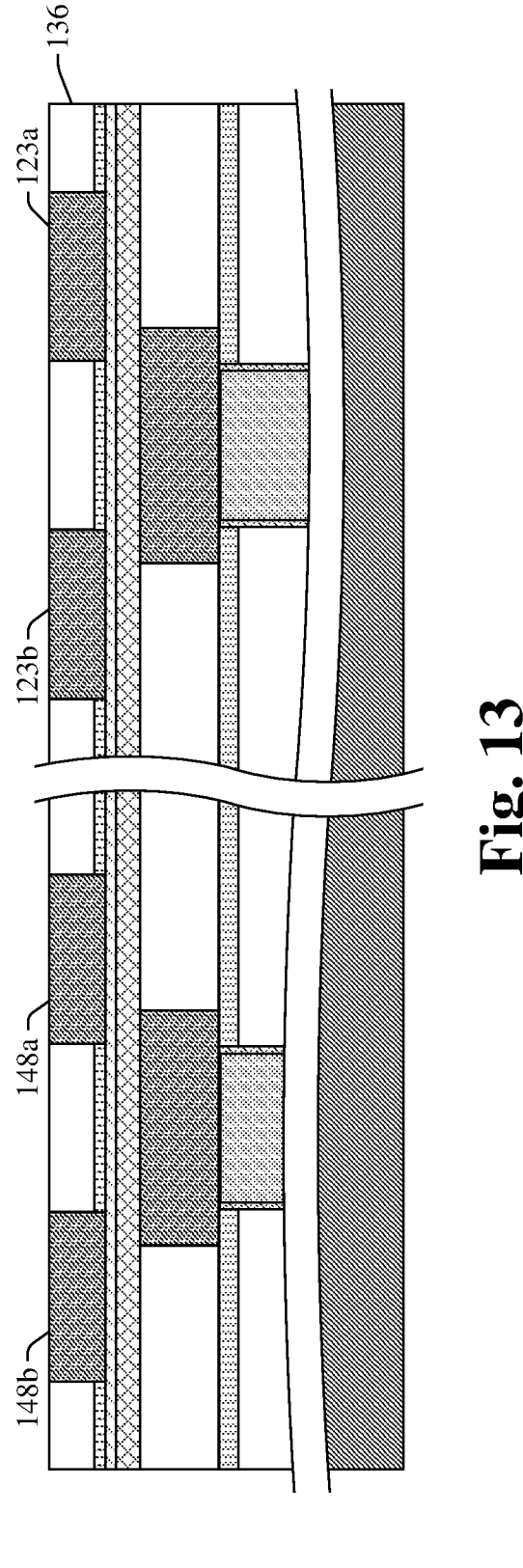

As shown in the cross-sectional view 1300 of FIG. 13, portions of the source/drain material (e.g., 1202 of FIG. 12) above an upper surface of the third dielectric 136 are removed, forming the first source/drain terminals 123a, 148a and second source/drain terminals 123b, 148b. In some embodiments, the portions of the source/drain material are removed using a planarization process (e.g., a CMP process).

Figure 14:
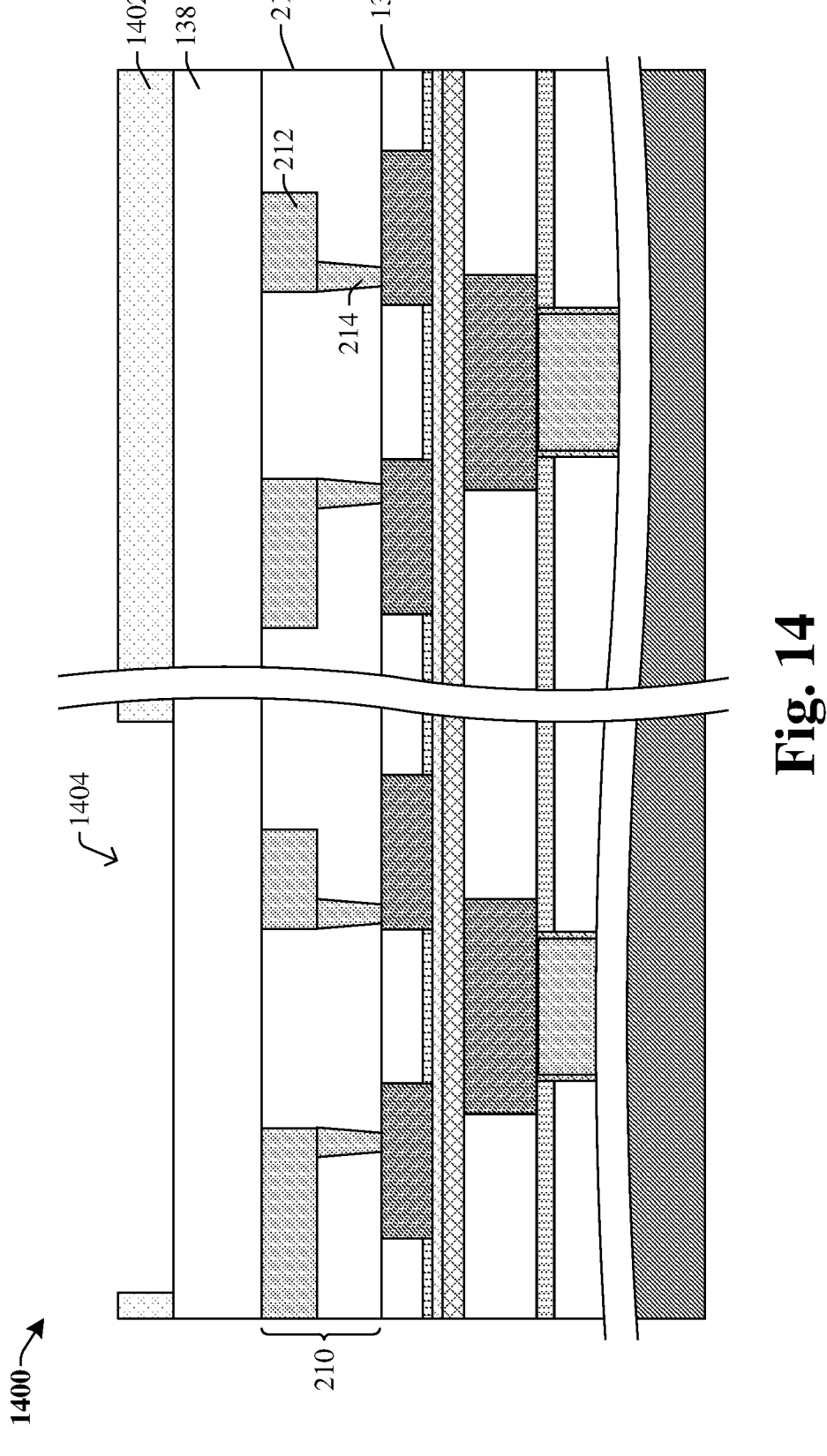

As shown in the cross-sectional view 1400 of FIG. 14, a fourth dielectric 138 and a third masking layer 1402 are formed over the third dielectric 136. In some embodiments, the second interconnect structure 210 and the interconnect dielectric 211 are formed over the third dielectric 136 prior to forming the fourth dielectric 138. The third masking layer 1402 is then patterned to form a third opening 1404 over the fourth dielectric 138 corresponding to the metal barrier layer (see 112 of FIG. 1B). In some embodiments, the third masking layer 1402 is patterned using photolithography or the like. In some embodiments, the one or more wire levels 212 and the one or more via levels 214 are formed using one of CVD, ALD, PVD, electrochemical plating, one or more damascene processes, on or more dual damascene processes, the like, or a combination of the foregoing.

Figure 15:
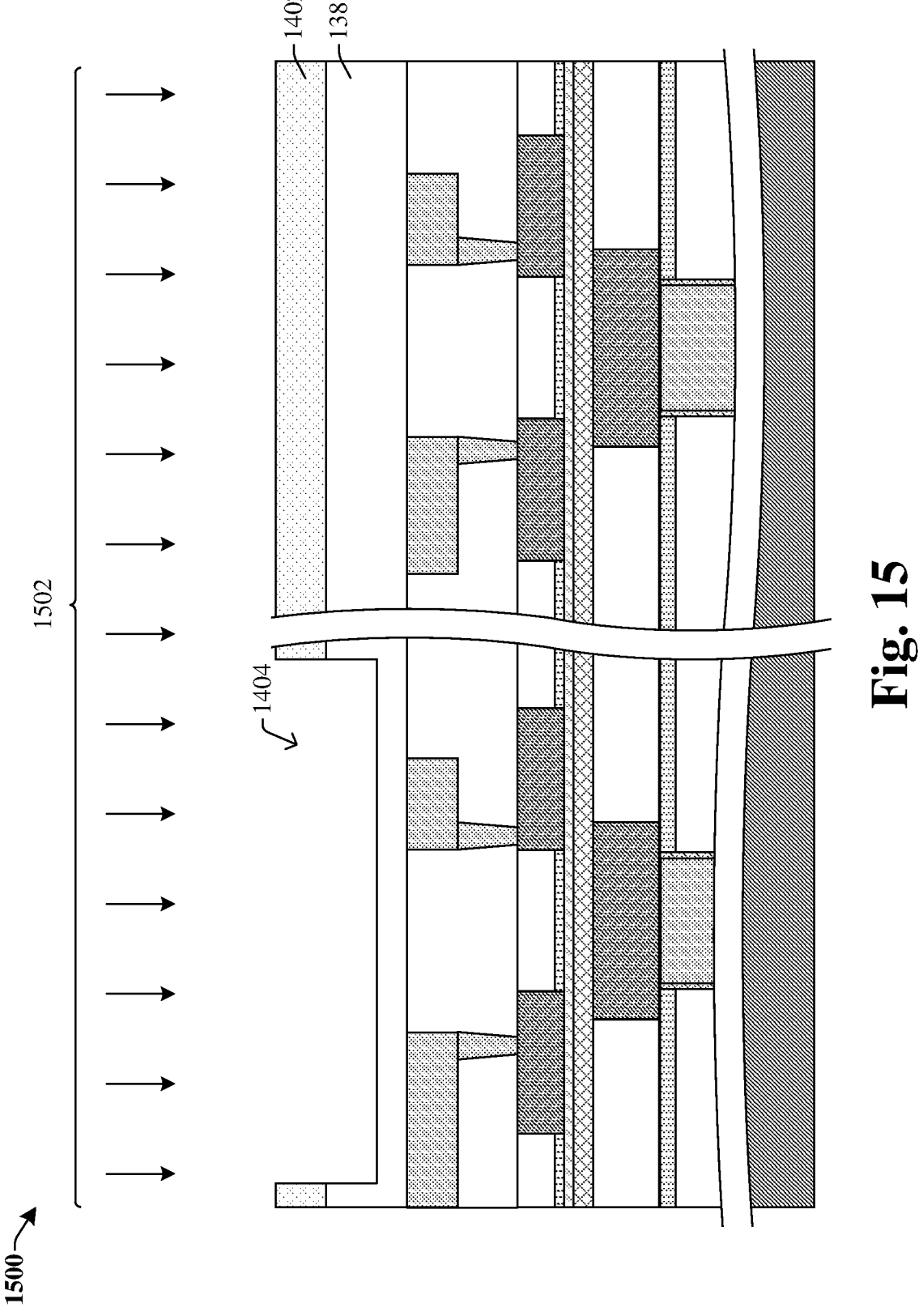

As shown in the cross-sectional view 1500 of FIG. 15, a third etching process 1502 is performed, removing portions of the fourth dielectric 138 corresponding to the third opening 1404 and extending the third opening 1404 into the fourth dielectric 138. In some embodiments, the third etching process 1502 is a dry etch (e.g., a plasma dry etch). The third masking layer 1402 is subsequently removed using, for example, a stripping process or an ashing process.

Figure 16:
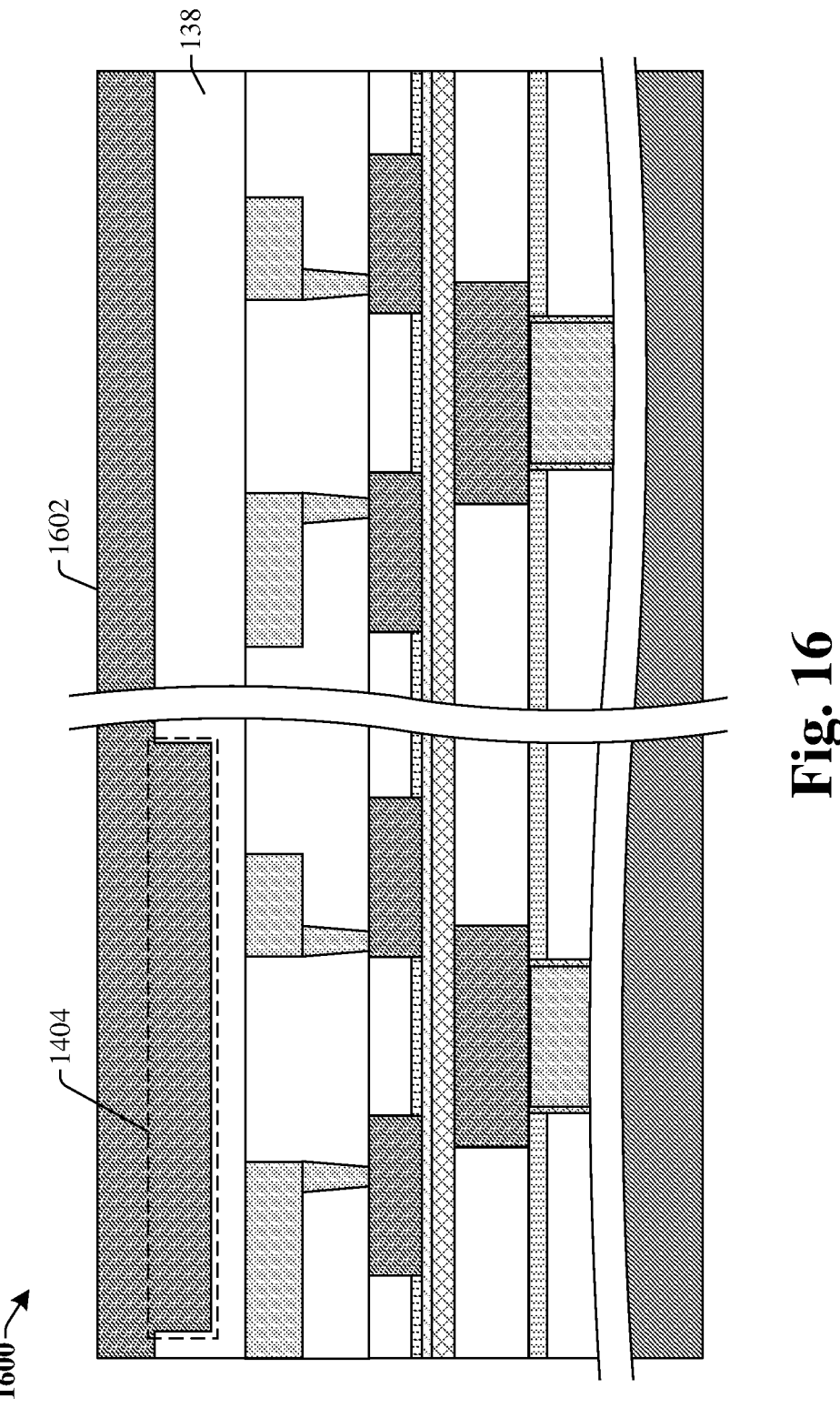

As shown in the cross-sectional view 1600 of FIG. 16, a metal barrier layer material 1602 is formed in the third opening 1404 (shown in phantom) and over the fourth dielectric 138. The metal barrier layer material 1602 may be formed using one or more of atomic layer deposition (ALD), chemical vapor deposition (CVD), physical vapor deposition (PVD), or the like.

Figure 17:
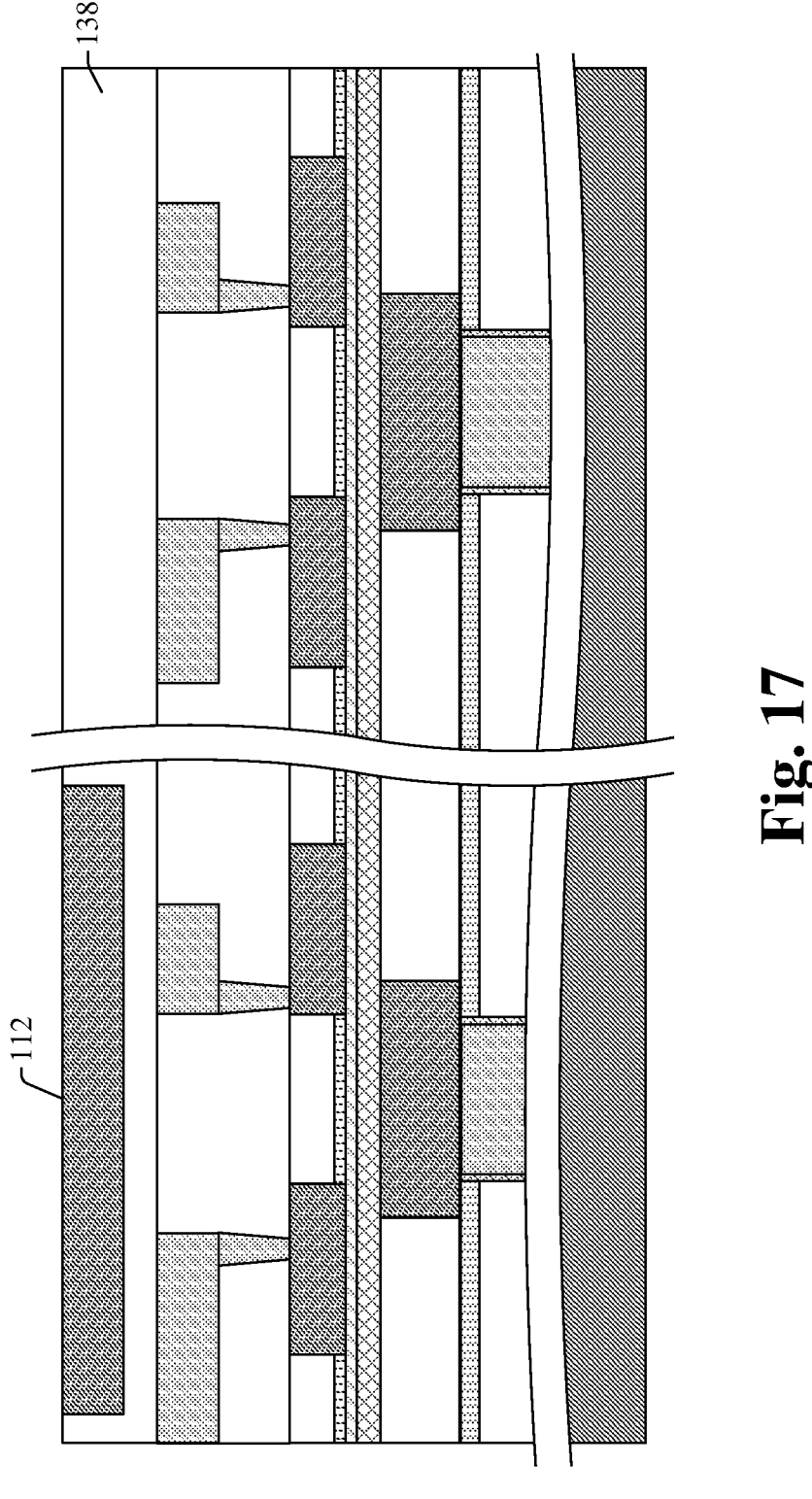

As shown in the cross-sectional view 1700 of FIG. 17, portions of the metal barrier layer material (e.g., 1602 of FIG. 16) above an upper surface of the fourth dielectric 138 are removed, forming the metal barrier layer 112. In some embodiments, the portions of the metal barrier layer material are removed using a planarization process (e.g., a chemical mechanical planarization (CMP) process).

Figure 18:
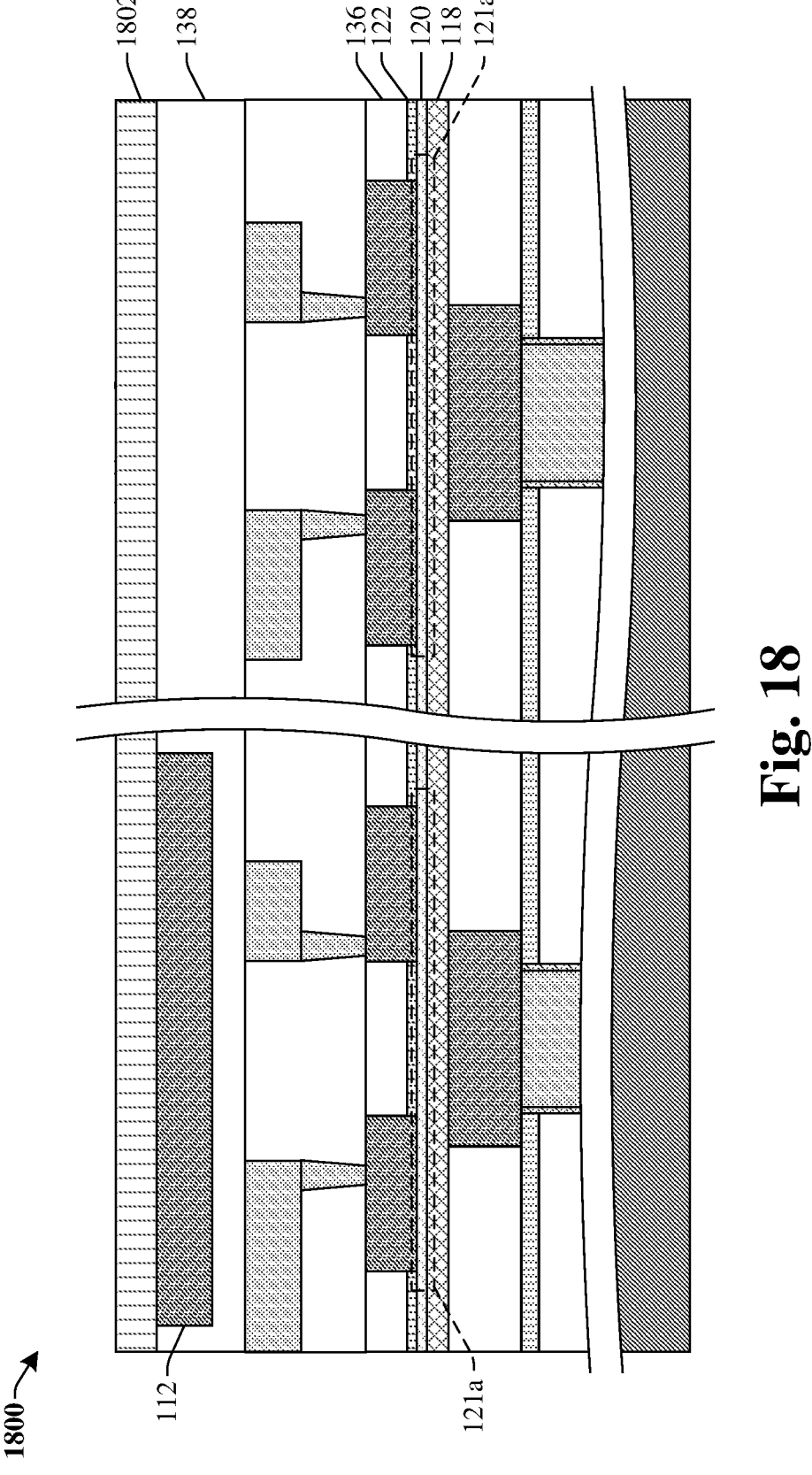

As shown in the cross-sectional view 1800 of FIG. 18, a lens material 1802 is formed over the fourth dielectric 138. The lens material 1802 is formed using a deposition process, a spin-on process, a spray-on process, or the like. In some embodiments, the lens material 1802 is or comprises an i-line or deep ultraviolet (DUV) photoresist (not limiting). In some embodiments, the fourth dielectric is or comprises an acrylic based resist, a polyimide resist, an epoxy resist, polyorganosiloxane, polyorganosilicate, or the like. The lens material 1802 has an absolute refractive index greater than 1.6.

Figure 19:
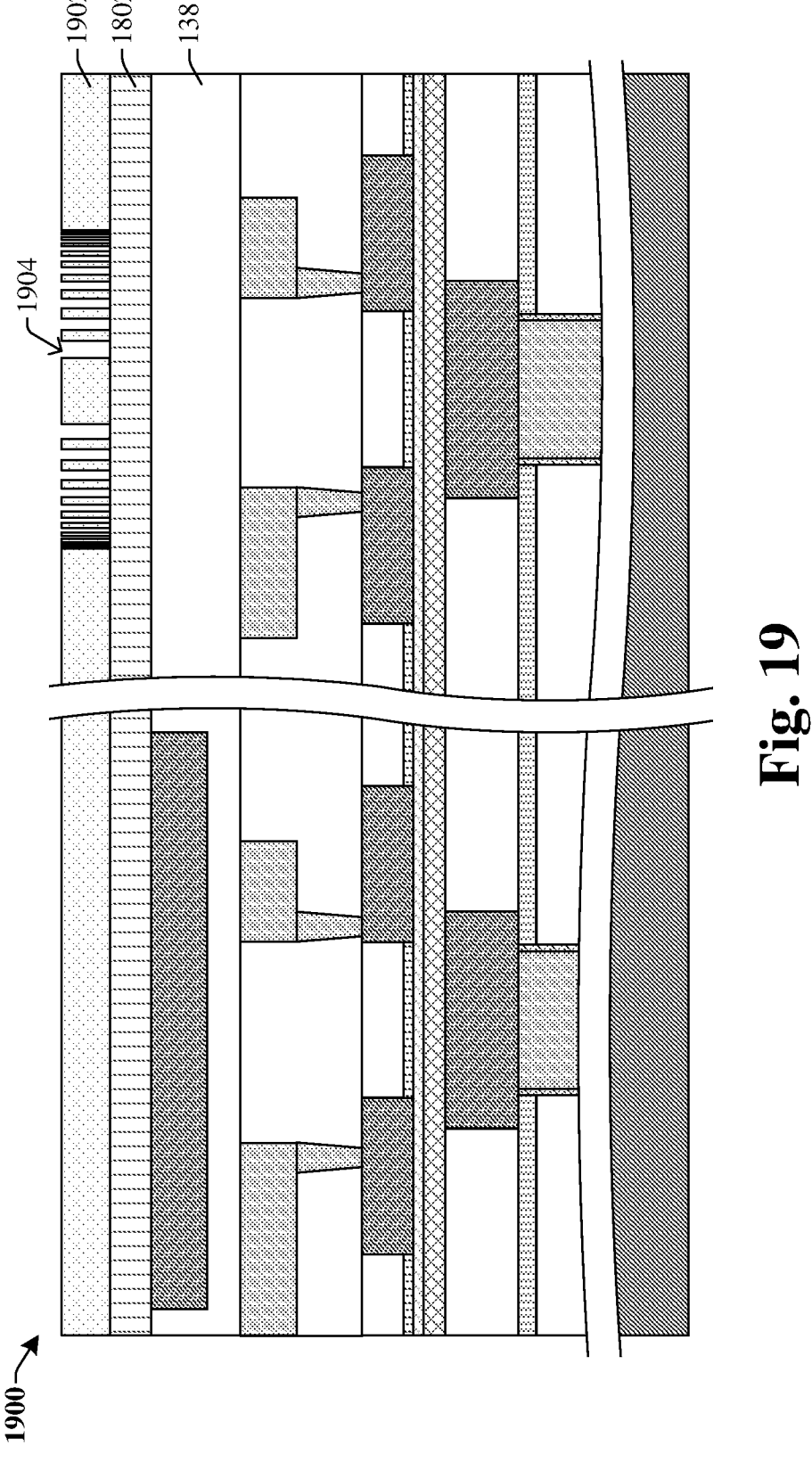

As shown in the cross-sectional view 1900 of FIG. 19, a fourth masking layer 1902 is formed over the lens material 1802. In some embodiments, the fourth masking layer 1902 may be, for example, a photoresist. In some embodiments, the fourth masking layer 1902 may be formed using one of a deposition process or a spin-on process. The fourth masking layer 1902 is then patterned to form fourth openings 1904 in the fourth masking layer 1902. In some embodiments, the fourth masking layer 1902 is patterned using photolithography or the like.

Figure 20:
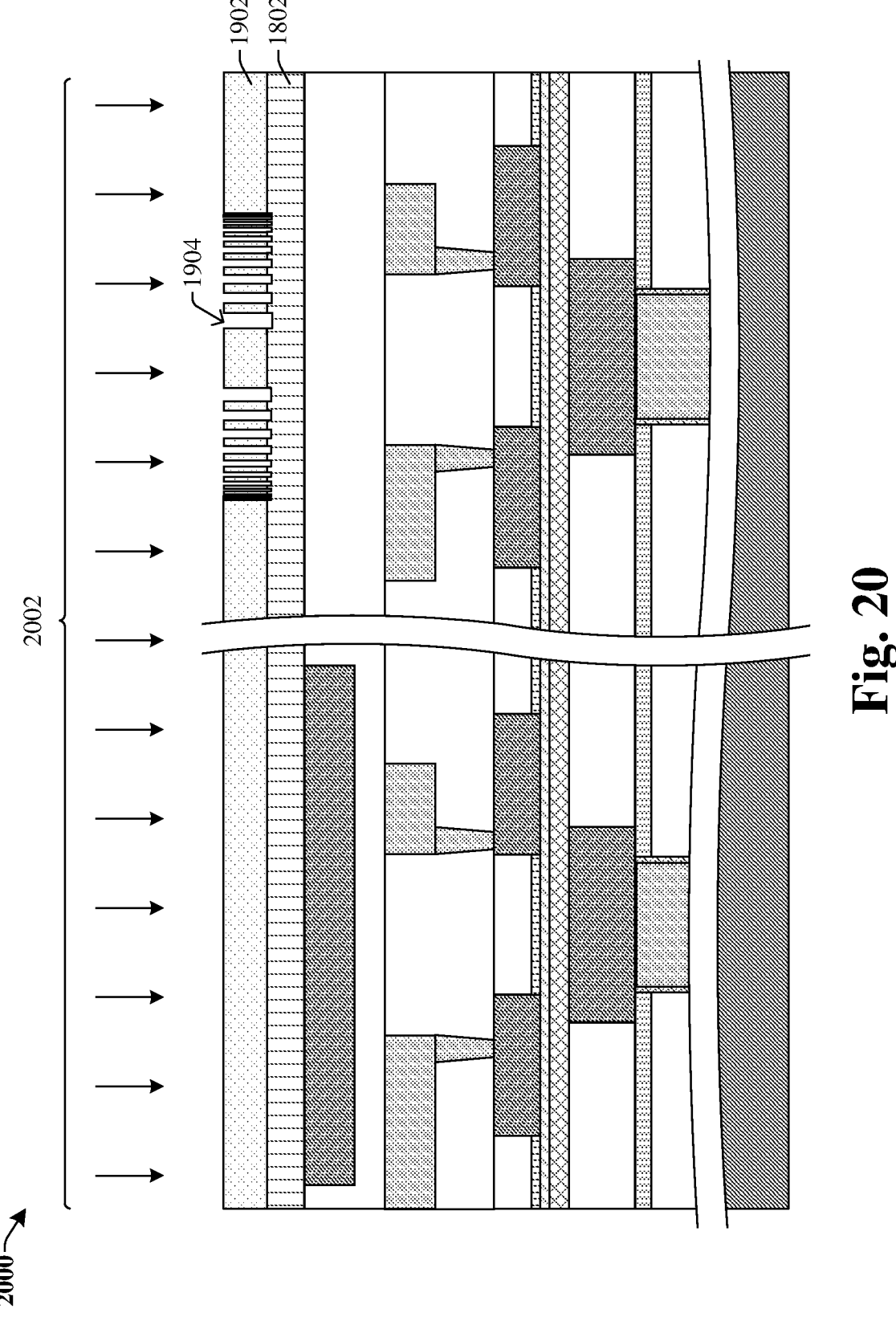

As shown in the cross-sectional view 2000 of FIG. 20, a fourth etching process 2002 is performed, removing portions of the lens material 1802 exposed by the fourth openings 1904. In some embodiments, the fourth etching process 2002 is a dry etch (e.g., a plasma dry etch). The lens material 1802 has the top surface, and the fourth etching process 2002 results in upper surfaces of the lens material 1802 at a third depth 206 (See FIG. 2C) below the top surface. The fourth masking layer 1902 is subsequently removed using, for example, a stripping process or an ashing process.

Figure 21:
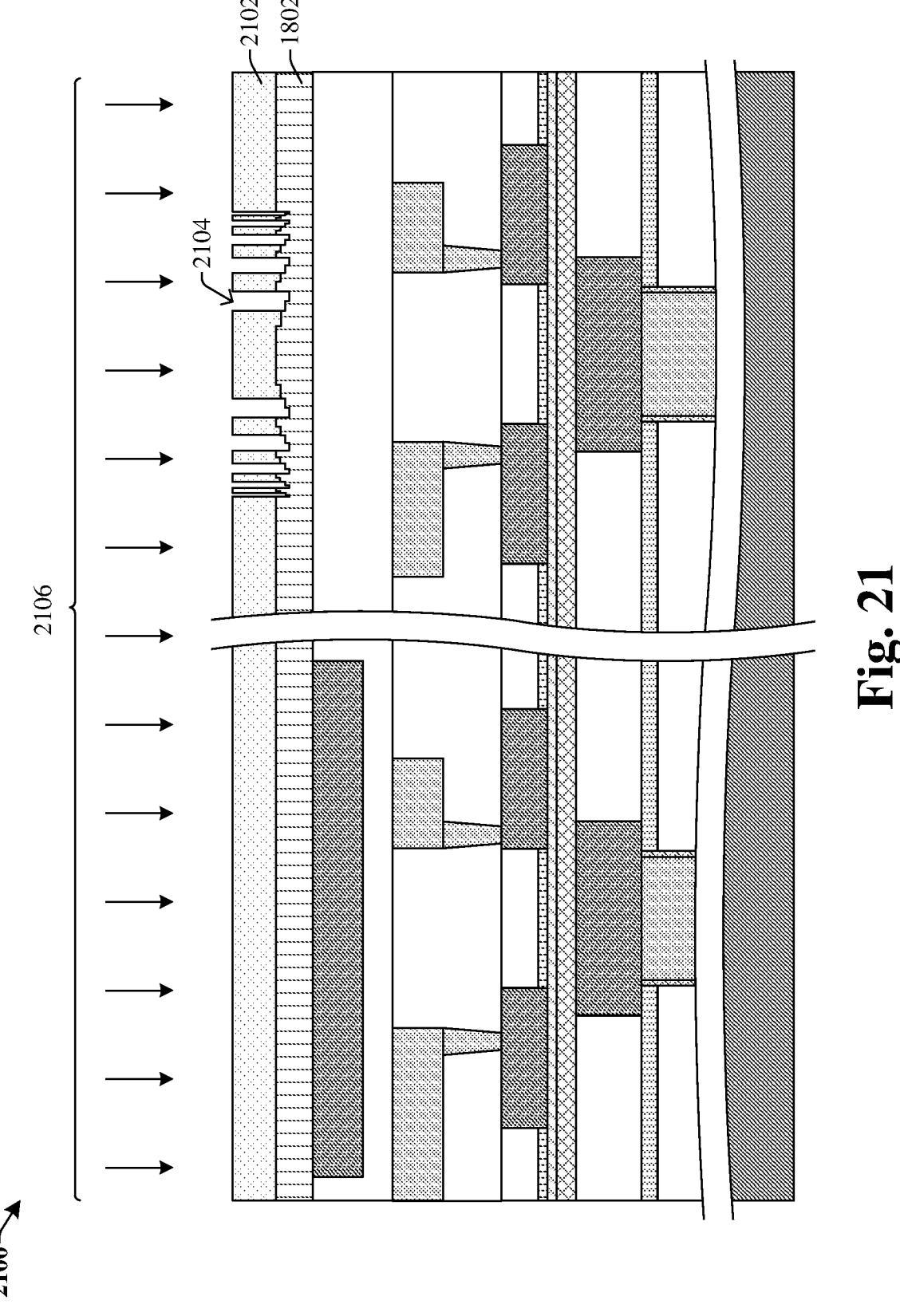

As shown in the cross-sectional view 2100 of FIG. 21, a fifth masking layer 2102 is formed over the lens material 1802. The fifth masking layer 2102 is then patterned to form fifth openings 2104 in the fifth masking layer 2102. In some embodiments, the fifth masking layer 2102 is patterned using photolithography or the like. A fifth etching process 2106 is then performed, removing portions of the lens material 1802 exposed by the fifth openings 2104. The portions of the lens material 1802 exposed by the fifth openings 2104 include both portions of the lens material 1802 at the top surface and portions of the lens material 1802 with upper surfaces at a third depth 206. The fifth etching process 2106 removes exposed portions of the material such that the lens material 1802 has portions with upper surfaces at a second depth 204 greater than the third depth 206 and a first depth 202 greater than the second depth 204. The difference between the first height and the second height is substantially equal to the difference between the third height and the fourth height. The fifth masking layer 2102 is subsequently removed using, for example, a stripping process or an ashing process.

Figure 22:
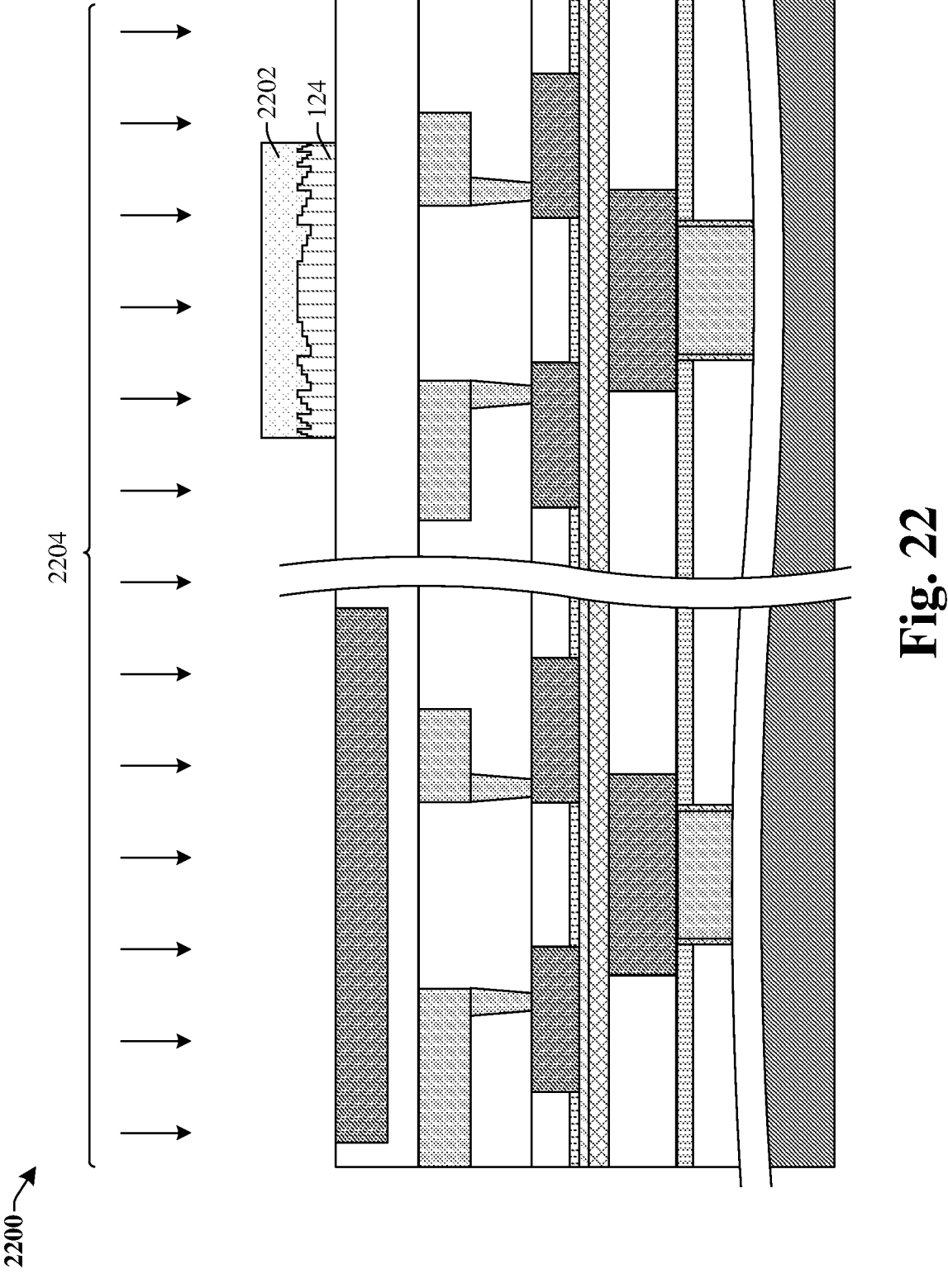

As shown in the cross-sectional view 2200 of FIG. 22, a sixth masking layer 2202 is formed over the lens material (e.g., 1802 of FIG. 21). The sixth masking layer 2202 is then patterned to expose portions of the lens material that will not be part of the Fresnel lens 124. In some embodiments, the sixth masking layer 2202 is patterned using photolithography or the like. A sixth etching process 2204 is then performed, removing exposed portions of the lens material and resulting in the Fresnel lens being formed. The sixth masking layer 2202 is subsequently removed using, for example, a stripping process or an ashing process.

Figure 23:
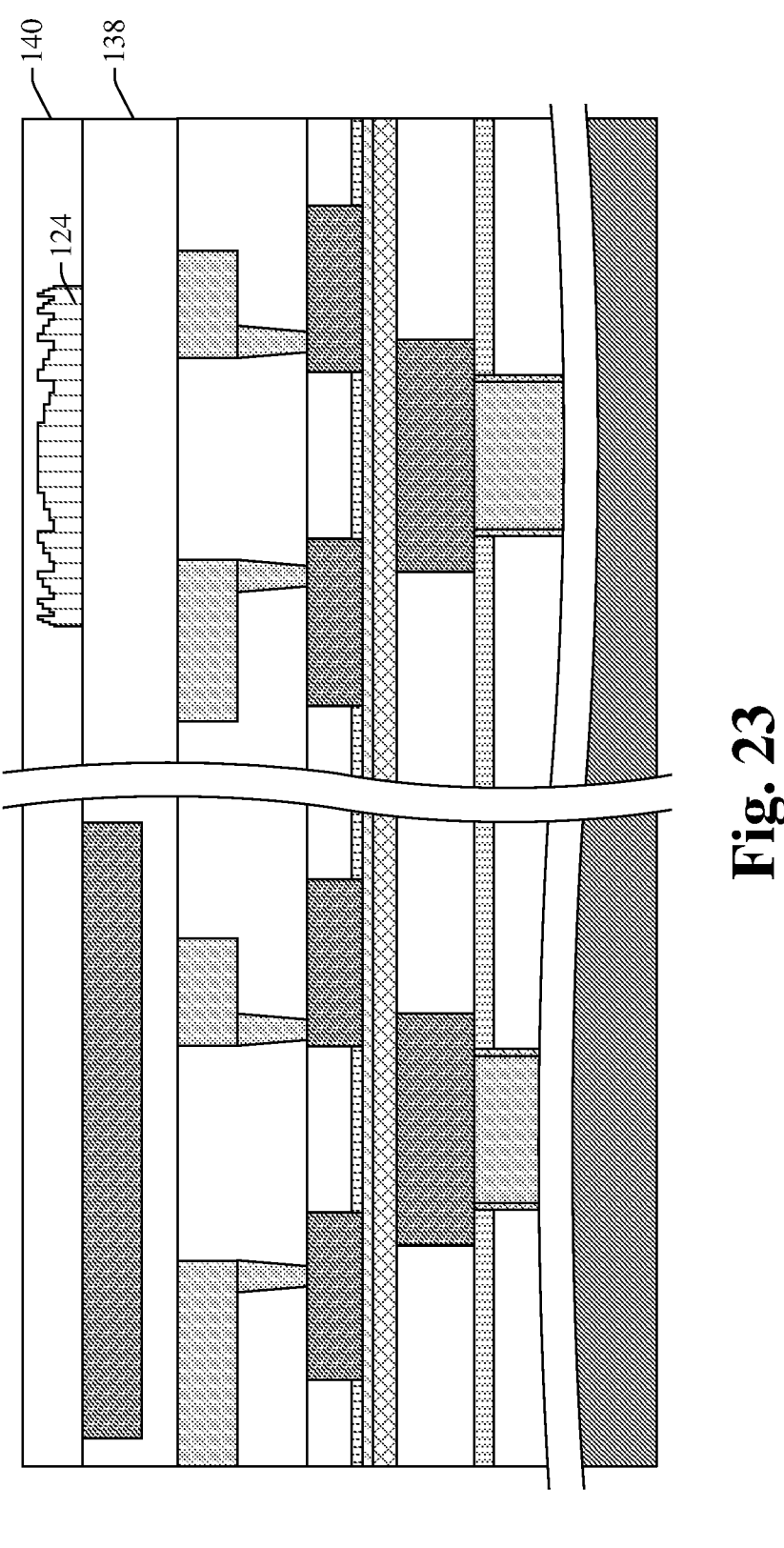

As shown in the cross-sectional view 2300 of FIG. 23, the fifth dielectric 140 is formed over the Fresnel lens 124. The fifth dielectric 140 may be formed using one or more of atomic layer deposition (ALD), chemical vapor deposition (CVD), physical vapor deposition (PVD), or the like. In some embodiments, a planarization process (e.g., a CMP process) is performed to remove upper portions of the fifth dielectric 140, resulting in a substantially smooth upper surface.

FIG. 24 illustrates a methodology 2400 in flowchart format that illustrates some embodiments of a method of forming an intrusion detection circuit comprising a first TFT and a second TFT covered by a metal barrier layer. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 2402, a first dielectric layer formed over a substrate is patterned to form a first gate opening and a second gate opening. See, for example, FIGS. 5 and 6.

At 2404, a first gate is formed within the first gate opening and a second gate within the second gate opening. See, for example, FIGS. 7 and 8.

At 2406, a first channel is formed over the first gate and the second gate. See, for example, FIG. 9.

At 2408, first source/drain terminals are formed within a second dielectric layer on a top surface of the first channel. See, for example, FIGS. 10, 11, 12, and 13.

At 2410, a blocking layer is formed over the second dielectric layer and directly above the first gate. See, for example, FIGS. 14, 15, 16, and 17.

At 2412, a lens material is formed over the second dielectric layer and directly above the second gate. See, for example, FIG. 18.

At 2414, one or more etching processes are performed on the lens material to form a Fresnel lens over the first channel, the Fresnel lens having a focal point over a bottom surface of the first channel. See, for example, FIGS. 20, 21, and 22.

Some embodiments relate to an integrated device including a first thin film transistor (TFT) arranged over a substrate; a second TFT arranged over the substrate; a metal barrier layer arranged over the second TFT, where the metal barrier layer is configured to block incident radiation from reaching the second TFT; a Fresnel lens arranged over the first TFT, where the Fresnel lens is configured to focus incident radiation towards the first TFT; and where the first TFT and the second TFT are configured to be coupled to a differential amplifier, the differential amplifier being operable to detect the incident radiation by comparison of a first leakage current from the first TFT to a second leakage current from the second TFT.

Other embodiments relate to an integrated device including a first gate structure and a second gate structure arranged over a substrate; a channel layer disposed over the first gate structure and the second gate structure; a first pair of source/drain regions arranged over the channel layer and along opposing sides of the first gate structure; a second pair of source/drain regions arranged over the channel layer and along opposing sides of the second gate structure; a metal barrier layer arranged over the first pair of source/drain regions; and a Fresnel lens arranged over the second pair of source/drain regions.

Yet other embodiments relate to a method of forming an integrated device including patterning a first dielectric layer formed over a substrate to form a first gate opening and a second gate opening; forming a first gate within the first gate opening and a second gate within the second gate opening; forming a first channel over the first gate and the second gate; forming first source/drain terminals within a second dielectric layer on a top surface of the first channel; forming a blocking layer over the second dielectric layer and directly above the first gate; forming a lens material over the second dielectric layer and directly above the second gate; and performing one or more etching processes on the lens material to form a Fresnel lens over the first channel, the Fresnel lens having a focal point over a bottom surface of the first channel.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated device, comprising:
   patterning a first dielectric layer formed over a substrate to form a first gate opening and a second gate opening;
   forming a first gate within the first gate opening and a second gate within the second gate opening;
   forming a first channel over the first gate and the second gate;
   forming source/drain terminals within a second dielectric layer on a top surface of the first channel;
   forming a blocking layer over the second dielectric layer and directly above the first gate;
   forming a lens material over the second dielectric layer and directly above the second gate; and performing one or more etching processes on the lens material to form a Fresnel lens over the first channel, the Fresnel lens having a focal point over a bottom surface of the first channel.

2. The method of claim 1, further comprising:

forming a capping layer over the first channel before forming the source/drain terminals, wherein the source/drain terminals extend along sidewalls of the capping layer, and wherein the focal point of the Fresnel lens is between a top surface of the capping layer and a bottom surface of the first channel.

3. The method of claim 2, wherein the source/drain terminals extend over the capping layer.

4. The method of claim 1, wherein the blocking layer is formed in a third dielectric layer, and has a top surface level with a top surface of the third dielectric layer, and wherein the lens material is formed on the top surface of the third dielectric layer.

5. The method of claim 1, further comprising:

forming a differential amplifier over the substrate, the differential amplifier having a first input and a second input; and forming an interconnect structure coupling a first source/drain terminal of the source/drain terminals to the first input and a second source/drain terminal of the source/drain terminals to the second input.

6. The method of claim 1, wherein the source/drain terminals extend over the first gate.

7. A method of forming an integrated device, comprising:

forming a first wire level over a substrate, the first wire level comprising a first wire and a second wire;

forming a first gate over the first wire and a second gate over the second wire, wherein the first gate and the second gate are separated by a first dielectric layer, and wherein the first gate has a first width;

forming a first gate dielectric layer over the first gate and the second gate;

forming a first channel layer over the first gate and the second gate;

forming source/drain terminals on a top surface of the first channel layer, wherein a first set of source/drain terminals over the first gate have first sidewalls facing away from the first gate that are separated by a first distance that is greater than the first width;

forming a blocking layer over the source/drain terminals and directly above the first gate, wherein the blocking layer has a second width that is greater than the first distance; and forming a Fresnel lens over the first channel layer and the second gate, the Fresnel lens having a focal point over a bottom surface of the first channel layer.

8. The method of claim 7, further comprising forming a second wire level over the source/drain terminals before forming the blocking layer, wherein the second wire level comprises wires coupled to the source/drain terminals.

9. The method of claim 7, wherein the first set of source/drain terminals have second sidewalls facing a center of the first gate that are separated by a second distance that is less than the first width.

10. The method of claim 7, wherein after the Fresnel lens is formed, the Fresnel lens has a bottom surface at a first height above the first gate and the second gate, and the blocking layer has a bottom surface at a second height above the first gate and the second gate, and wherein the first height is greater than the second height.

11. The method of claim 7, wherein forming the blocking layer further comprises:

forming a dielectric layer over the source/drain terminals;

etching an opening in the dielectric layer spanning past first sidewalls of the first set of source/drain terminals;

filling the opening with a metal material; and removing portions of the metal material extending past the opening.

12. The method of claim 11, wherein after the blocking layer is formed, the blocking layer has a sidewall between the first gate and the second gate.

13. The method of claim 7, further comprising forming a capping layer on the first channel layer.

14. The method of claim 13, wherein forming the source/drain terminals further comprises:

forming a dielectric layer over the capping layer;

etching openings through the dielectric layer and the capping layer, exposing an upper surface of the first channel layer;

depositing a source/drain material into the openings; and removing portions of the source/drain material above an upper surface of the dielectric layer.

15. The method of claim 13, wherein the source/drain terminals are spaced from the blocking layer in a vertical direction by a dielectric layer.

16. A method of forming an integrated device, comprising:

forming a first gate and a second gate over a substrate, wherein the first gate and the second gate are spaced in a first direction;

forming a first gate dielectric over the first gate and the second gate;

forming a first channel layer over the first gate dielectric, the first channel layer extending from the first gate to the second gate in the first direction;

forming a capping layer over the first channel layer, the capping layer extending from the first gate to the second gate in the first direction;

forming a first set of source/drain terminals overlying the first gate and a second set of source/drain terminals overlying the second gate;

forming a blocking layer over the first gate and the first set of source/drain terminals, wherein the blocking layer is spaced from the first gate and the first set of source/drain terminals in a second direction perpendicular to the first direction; and forming a Fresnel lens over the second gate and the second set of source/drain terminals, wherein the Fresnel lens is spaced from the blocking layer in the first direction and the second direction.

17. The method of claim 16, wherein after the first set of source/drain terminals and the second set of source/drain terminals are formed, the first gate extends from a first source/drain terminal of the first set to a second source/drain terminal of the first set in the first direction.

18. The method of claim 17, wherein after the blocking layer is formed, the first source/drain terminal has a first sidewall facing away from the first gate and towards a first sidewall of the blocking layer, and the second source/drain terminal has a second sidewall facing away from the first gate and towards a second sidewall of the blocking layer that is opposite the first sidewall of the blocking layer.

19. The method of claim 16, wherein the first gate dielectric extends from the first gate to the second gate in the first direction and covers top surfaces of the first gate and the second gate.

20. The method of claim 16, wherein the blocking layer is formed in a first dielectric layer and wherein the Fresnel lens is formed over the first dielectric layer.

* * * * *